(12) United States Patent
Zhou et al.

(10) Patent No.: US 12,406,604 B2
(45) Date of Patent: Sep. 2, 2025

(54) DISPLAY SUBSTRATE, REPAIR METHOD AND DISPLAY DEVICE

(71) Applicants: HEFEI BOE DISPLAY TECHNOLOGY CO., LTD., Anhui (CN); BOE TECHNOLOGY GROUP CO., LTD., Beijing (CN)

(72) Inventors: Maoxiu Zhou, Beijing (CN); Lei Guo, Beijing (CN); Ke Dai, Beijing (CN); Chunxu Zhang, Beijing (CN); Min Cheng, Beijing (CN); Xiaoting Jiang, Beijing (CN); Haipeng Yang, Beijing (CN)

(73) Assignees: HEFEI BOE DISPLAY TECHNOLOGY CO., LTD., Hefei (CN); BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 18/264,331

(22) PCT Filed: Sep. 23, 2022

(86) PCT No.: PCT/CN2022/120808
§ 371 (c)(1),
(2) Date: Aug. 4, 2023

(87) PCT Pub. No.: WO2024/060186
PCT Pub. Date: Mar. 28, 2024

(65) Prior Publication Data
US 2025/0014491 A1 Jan. 9, 2025

(51) Int. Cl.
*G09G 3/20* (2006.01)

(52) U.S. Cl.
CPC ....... *G09G 3/20* (2013.01); *G09G 2300/0426* (2013.01); *G09G 2310/0267* (2013.01); *G09G 2310/0286* (2013.01); *G09G 2330/08* (2013.01)

(58) Field of Classification Search
CPC ............ G09G 3/20; G09G 2300/0426; G09G 2310/0267; G09G 2310/0286; G09G 2330/08
See application file for complete search history.

(56) References Cited

U.S. PATENT DOCUMENTS

2006/0289939 A1  12/2006  Kim et al.
2007/0132700 A1   6/2007  Cho et al.
(Continued)

FOREIGN PATENT DOCUMENTS

CN     1885105 A    12/2006
CN   202736457 U     2/2013
(Continued)

*Primary Examiner* — Sejoon Ahn
(74) *Attorney, Agent, or Firm* — MUNCY, GEISSLER, OLDS & LOWE, P.C.

(57) ABSTRACT

A driving module includes N driving circuits connected in series; the driving circuit includes an input terminal; N is a positive integer; input terminals of first a stages of driving circuits included in the driving module are electrically connected to an initial voltage line; a is a positive integer; an input terminal of an nth stage of driving circuit included in the driving module is electrically connected to an output terminal of an (n–m)th stage of driving circuit included in the driving module through an input cascade line; n and m are positive integers, and m is less than n; the driving module further includes at least one connection line, there is an overlapping portion between an orthographic projection of the connection line on the base substrate and an orthographic projection of the initial voltage line on the base substrate.

17 Claims, 22 Drawing Sheets

(56) References Cited

U.S. PATENT DOCUMENTS

| | | | |
|---|---|---|---|
| 2014/0292628 A1* | 10/2014 | Park | G09G 3/3677 |
| | | | 327/108 |
| 2017/0200409 A1 | 7/2017 | Zhao et al. | |
| 2020/0035317 A1 | 1/2020 | Feng et al. | |
| 2020/0135287 A1 | 4/2020 | Han | |
| 2021/0256889 A1* | 8/2021 | Yuan | H10D 86/60 |
| 2021/0265224 A1* | 8/2021 | Lin | H10D 84/0167 |
| 2021/0305989 A1* | 9/2021 | Han | H03L 7/07 |
| 2021/0313320 A1* | 10/2021 | Liaw | H10D 30/6735 |
| 2021/0313333 A1* | 10/2021 | Liaw | H10D 30/43 |
| 2021/0366425 A1* | 11/2021 | Zhang | G09G 3/3266 |
| 2021/0376040 A1* | 12/2021 | Youn | H10K 59/1315 |
| 2022/0068190 A1 | 3/2022 | Feng et al. | |
| 2023/0065254 A1 | 3/2023 | Li et al. | |
| 2023/0144117 A1 | 5/2023 | Xue et al. | |

FOREIGN PATENT DOCUMENTS

| | | |
|---|---|---|
| CN | 104766581 A | 7/2015 |
| CN | 108877683 A | 11/2018 |
| CN | 109166600 A | 1/2019 |
| CN | 110706667 A | 1/2020 |
| CN | 110767149 A | 2/2020 |
| CN | 111341791 A | 6/2020 |
| CN | 111736400 A | 10/2020 |
| CN | 115050305 A | 9/2022 |
| CN | 115064120 A | 9/2022 |
| WO | 2021203520 A1 | 10/2021 |

* cited by examiner

DISPLAY SUBSTRATE, REPAIR METHOD AND DISPLAY DEVICE

CROSS REFERENCE TO RELATED APPLICATIONS

The present disclosure in the U.S. national phase of PCT Application No. PCT/CN2022/120808 filed on Sep. 23, 2022, which is incorporated herein by reference in its entirety.

TECHNICAL FIELD

The present disclosure relates to the field of display technology, in particular to a display substrate, a repair method and a display device.

BACKGROUND

In the related art, when a large-size display substrate is to be cut to form a small-size display substrate, since the initial voltage is output by the timing controller (TCON) and then output to the initial voltage line through a level shifter, TCON is set in the driver integrated circuit (IC), and the initial voltage line extends from the driver IC side to a side away from the driver IC. If a cut is performed in a horizontal direction (a direction in which the gate line extends), the initial voltage line will be cut down, so that the display substrate obtained after cutting cannot work normally.

SUMMARY

In one aspect, the present disclosure provides in some embodiments a display substrate, including a base substrate and a driving module arranged on the base substrate; wherein the driving module includes N driving circuits connected in series; the driving circuit includes an input terminal; N is a positive integer; input terminals of first a stages of driving circuits included in the driving module are electrically connected to an initial voltage line; a is a positive integer; an input terminal of an nth stage of driving circuit included in the driving module is electrically connected to an output terminal of an (n−m)th stage of driving circuit included in the driving module through an input cascade line; n and m are positive integers, and m is less than n; the driving module further includes at least one connection line, and the connection line extends along a first direction; there is an overlapping portion between an orthographic projection of the connection line on the base substrate and an orthographic projection of the initial voltage line on the base substrate; there is an overlapping portion between the orthographic projection of the connection line on the base substrate and an orthographic projection of the input cascade line on the base substrate.

Optionally, at least part of the connection line is located on different layers from the initial voltage line, and at least part of the connection line is located on different layers from the input cascade line.

Optionally, the connection line is arranged between two adjacent driving circuits; or, the connection line penetrates through at least part of the driving circuit.

Optionally, the driving module includes a plurality of clock signal lines, a plurality of stages of driving circuits and a line collection portion; the driving circuit includes a first driving circuit portion and a second driving circuit portion; the plurality of clock signal lines, the first driving circuit portion, the line collection portion and the second driving circuit portion are arranged in sequence along a direction close to a display area; the input cascade line is arranged in the line collection portion; the driving circuit includes the first driving circuit portion and the second driving circuit portion.

Optionally, the second driving circuit portion includes an output transistor in the driving circuit; the first driving circuit portion includes a pull-up node control sub-circuit, a pull-down node control sub-circuit and an output reset sub-circuit; the pull-up node control sub-circuit is configured to control a potential of the pull-up node, and the pull-down node control sub-circuit is configured to control a potential of the pull-down node, and the output reset sub-circuit is used to reset a driving signal under the control of the potential of the pull-down node.

Optionally, the connection line included in the driving module penetrates through the clock signal line, the first driving circuit portion and the line collection portion included in the driving circuit along a direction from away from the display area to close to the display area.

Optionally, the display panel includes a first metal layer and an electrode layer arranged in sequence in a direction away from the base substrate; the connection line includes a first line portion formed on the electrode layer and a second line portion formed on the first metal layer; the first line portion is electrically connected to the second line portion; at least part of the first line portion is arranged in a clock signal line area, the first driving circuit portion and the line collection portion; the clock signal line area is an area where the plurality of clock signal lines are arranged; at least part of the second line portion is arranged on the line collection portion.

Optionally, the display panel includes an electrode layer and a first metal layer arranged on a side of the base substrate; the connection line is formed by the electrode layer or the first metal layer.

Optionally, the driving circuit includes an input circuit; a control terminal of the input circuit and/or a first terminal of the input circuit are electrically connected to an input terminal, and a second terminal of the input circuit is electrically connected to the pull-up node; the input circuit is configured to control the potential of the pull-up node under the control of an input signal provided by the input terminal.

Optionally, the input circuit includes a first transistor; a gate electrode of the first transistor is electrically connected to a first input terminal, a first electrode of the first transistor is electrically connected to a second input terminal, and a second electrode of the first transistor is electrically connected to the pull-up node; the first input terminal and the second input terminal are electrically connected or not electrically connected.

Optionally, the gate electrode of the first transistor is formed on a second metal layer, and the first electrode of the first transistor is formed on a first metal layer; the gate electrode of the first transistor is electrically connected to a first connection line portion formed on the second metal layer; the first electrode of the first transistor is electrically connected to a second connection line portion formed on the second metal layer through a via hole; the connection line includes a third connection line portion formed on the electrode layer and a fourth connection line portion formed on the first metal layer; the third connection line portion is electrically connected to the fourth connection line portion; there is an overlapping portion between an orthographic projection of the third connection line portion on the base substrate and an orthographic projection of the first connection line portion on the base substrate; there is an overlapping portion between an orthographic projection of the fourth connection line portion on the base substrate and an orthographic projection of the second connection line portion on the base substrate.

Optionally, the display substrate further includes a fifth connection line portion and a sixth connection line portion; wherein the fifth connection line portion is formed on the electrode layer, and the fifth connection line portion is connected to the third connection line portion; the sixth connection line portion is formed on the first metal layer, and the sixth connection line portion is connected to the fourth connection line portion; the fifth connection line portion is electrically connected to the sixth connection line portion.

Optionally, the display substrate further includes a fifth connection line portion; the fifth connection line portion is formed on the electrode layer, and the fifth connection line portion is connected to the third connection line portion.

Optionally, the gate electrode of the first transistor is formed on the second metal layer, and the first electrode of the first transistor is formed on the first metal layer; the gate electrode of the first transistor is electrically connected to the first connection line portion formed on the second metal layer; the first electrode of the first transistor is electrically connected to the second connection line portion formed on the second metal layer through a via hole; the connection line includes a third connection line portion formed on the electrode layer; there is an overlapping portion between an orthographic projection of the third connection line portion on the base substrate and an orthographic projection of the first connection line portion on the base substrate; there is an overlapping portion between the orthographic projection of the third connection line portion on the base substrate and an orthographic projection of the second connection line portion on the base substrate.

Optionally, the gate electrode of the first transistor is electrically connected to the first electrode of the first transistor; there is an overlapping portion between the orthographic projection of the connection line on the base substrate and an orthographic projection of the gate electrode of the first transistor on the base substrate; or, there is an overlapping portion between the orthographic projection of the connection line on the base substrate and an orthographic projection of the first electrode of the first transistor on the base substrate.

Optionally, the driving circuit further includes an output reset circuit and at least one clock signal line; a control terminal of the output reset circuit is electrically connected to a reset control terminal, a first terminal of the output reset circuit is electrically connected to a driving signal output terminal of a current stage, and a second terminal of the output reset circuit is electrically connected to the first voltage line, the output reset circuit is configured to control to connect the driving signal output terminal of the current stage and the first voltage line under the control of a reset control signal provided by the reset control terminal; there is an overlapping portion between the orthographic projection of the connection line on the base substrate and an orthographic projection of the clock signal line on the base substrate; the control terminal of the output reset circuit is electrically connected to a seventh connection line portion; there is an overlapping portion between the orthographic projection of the connection line on the base substrate and an orthographic projection of the seventh connection line portion on the base substrate.

Optionally, the output reset circuit includes a reset control terminal and a second transistor; a gate electrode of the second transistor is electrically connected to the reset control terminal, a first electrode of the second transistor is electrically connected to the driving signal output terminal of the current stage, and a second electrode of the second transistor is electrically connected to the first voltage line; a reset control terminal of the nth stage of driving circuit is electrically connected to a driving signal output terminal of an (n+p)th stage of driving circuit; p is a positive integer.

Optionally, the driving circuit includes a first driving circuit portion; the first driving circuit portion includes an input circuit, an output reset circuit, a pull-up node control circuit, a first pull-down node control circuit, a second pull-down node control circuit and a reset circuit; the input circuit is configured to control the potential of the pull-up node under the control of the input signal provided by the input terminal; the pull-up node control circuit is configured to control the potential of the pull-up node; the first pull-down node control circuit is configured to control a potential of the first pull-down node; the second pull-down node control circuit is configured to control a potential of the second pull-down node; the reset circuit is configured to reset a driving signal provided by the driving signal output terminal of the current stage under the control of the potential of the first pull-down node and the potential of the second pull-down node.

Optionally, the input circuit comprises a first transistor; a gate electrode of the first transistor is electrically connected to the first input terminal, a first electrode of the first transistor is electrically connected to the second input terminal, and a second electrode of the first transistor is electrically connected to the pull-up node; the pull-up node control circuit includes a third transistor, a fourth transistor, a fifth transistor and a sixth transistor; a gate electrode of the third transistor is electrically connected to the reset terminal, a first electrode of the third transistor is electrically connected to the pull-up node, and a second electrode of the third transistor is electrically connected to the second voltage line; a gate electrode of the fourth transistor is electrically connected to the initial signal line, a first electrode of the fourth transistor is electrically connected to the pull-up node, and a second electrode of the fourth transistor is electrically connected to the second voltage line; a gate electrode of the fifth transistor is electrically connected to the first pull-down node, a first electrode of the fifth transistor is electrically connected to the pull-up node, and a second electrode of the fifth transistor is electrically connected to the second voltage line; a gate electrode of the sixth transistor is electrically connected to the second pull-down node, a first electrode of the sixth transistor is electrically connected to the pull-up node, and a second electrode of the sixth transistor is electrically connected to the second voltage line; the first pull-down node control circuit includes a seventh transistor, an eighth transistor, a ninth transistor, a tenth transistor, and an eleventh transistor; both a gate electrode of the seventh transistor and a first electrode of the seventh transistor are electrically connected to the first control voltage line, and a second electrode of the seventh transistor is electrically connected to the first pull-down control node; a gate electrode of the eighth transistor is electrically connected to the pull-up node, a first electrode of the eighth transistor is electrically connected to the first pull-down control node, and a second electrode of the eighth transistor is electrically connected to the second voltage line; a gate electrode of the ninth transistor is electrically connected to the first pull-down control node, a first electrode of the ninth transistor is electrically connected to the first control voltage line, and a second electrode of the ninth transistor is electrically connected to the first pull-down node; a gate electrode of the tenth transistor is electrically connected to the pull-up node, a first electrode of the tenth transistor is electrically connected to the first pull-down node, and a second electrode of the tenth transistor is electrically connected to the second voltage line; a gate electrode of the eleventh transistor is electrically connected to the first input terminal, a first electrode of the eleventh transistor is electrically connected to the first pull-down node, and a second electrode of the eleventh transistor is electrically connected to the second voltage line; the second pull-down node control circuit includes a twelfth transistor, a thirteenth transistor, a fourteenth transistor, a fifteenth transistor, and a sixteenth transistor; both a gate electrode of the twelfth transistor and a first electrode of the twelfth transistor are electrically connected to the second control voltage line, and a second electrode of the twelfth transistor is electrically connected to the second pull-down control node; a gate electrode of the thirteenth transistor is electrically connected to the pull-up node, a first electrode of the thirteenth transistor is electrically connected to the second pull-down control node, and a second electrode of the thirteenth transistor is electrically connected to the second voltage line; a gate electrode of the fourteenth transistor is electrically connected to the second pull-down control node, a first electrode of the fourteenth transistor is electrically connected to the second control voltage line, and a second electrode of the fourteenth transistor is electrically connected to the second pull-down node; a gate electrode of the fifteenth transistor is electrically connected to the pull-up node, a first electrode of the fifteenth transistor is electrically connected to the second pull-down node, and a second electrode of the fifteenth transistor is electrically connected to the second voltage line; a gate electrode of the sixteenth transistor is electrically connected to the first input terminal, a first electrode of the sixteenth transistor is electrically connected to the second pull-down node, and a second electrode of the sixteenth transistor is electrically connected to the second voltage line; the reset circuit includes a seventeenth transistor, an eighteenth transistor, a nineteenth transistor and a twentieth transistor; a gate electrode of the seventeenth transistor is electrically connected to the first pull-down node, a first electrode of the seventeenth transistor is electrically connected to the driving signal output terminal of the current stage, and a second electrode of the seventeenth transistor electrically connected to the first voltage line; a gate electrode of the eighteenth transistor is electrically connected to the first pull-down node, a first electrode of the eighteenth transistor is electrically connected to a carry signal output terminal of a current stage, and a second electrode of the eighteenth transistor electrically connected to the second voltage line; a gate electrode of the nineteenth transistor is electrically connected to the second pull-down node, a first electrode of the nineteenth transistor is electrically connected to the driving signal output terminal of the current stage, and a second electrode of the nineteenth transistor is electrically connected to the first voltage line; a gate electrode of the twentieth transistor is electrically connected to the second pull-down node, a first electrode of the twentieth transistor is electrically connected to the carry signal output terminal of the current stage, and a second electrode of the twentieth transistor is electrically connected to the second voltage line.

Optionally, the orthographic projection of the connection line on the base substrate partially overlaps an orthographic projection of the gate electrode of the fourth transistor on the base substrate; the orthographic projection of the connection line on the base substrate partially overlaps an orthographic projection of the gate electrode of the thirteenth transistor on the base substrate; the orthographic projection of the connection line on the base substrate partially overlaps an orthographic projection of the gate electrode of the fifteenth transistor on the base substrate; the orthographic projection of the connection line on the base substrate partially overlaps an orthographic projection of the gate electrode of the sixteenth transistor on the base substrate; the orthographic projection of the connection line on the base substrate partially overlaps an orthographic projection of the gate electrode of the twentieth transistor on the base substrate; the orthographic projection of the connection line on the base substrate partially overlaps an orthographic projection of the gate electrode of the nineteenth transistor on the base substrate; the orthographic projection of the connection line on the base substrate partially overlaps an orthographic projection of the gate electrode of the sixteenth transistor on the base substrate.

Optionally, the driving circuit further includes a second driving circuit portion; the second driving circuit portion includes a twenty-first transistor and a twenty-second transistor; a gate electrode of the twenty-first transistor is electrically connected to the pull-up node, a first electrode of the twenty-first transistor is electrically connected to the output clock signal terminal, and a second electrode of the twenty-first transistor is connected to the driving signal output terminal of the current stage; a gate electrode of the twenty-second transistor is electrically connected to the pull-up node, a first electrode of the twenty-second transistor is electrically connected to the output clock signal terminal, and a second electrode of the twenty-second transistor is electrically connected to the carry signal output terminal of the current stage.

Optionally, the second driving circuit portion further comprises a second transistor; a gate electrode of the second transistor is electrically connected to the reset control terminal, a first electrode of the second transistor is electrically connected to the driving signal output terminal of the current stage, and a second electrode of the second transistor is electrically connected to the first voltage line.

Optionally, a groove is provided between the first electrode of the twenty-first transistor and the second electrode of the twenty-first transistor; both the first electrode of the twenty-first transistor and the second electrode of the twenty-first transistor are formed on the first metal layer.

In a second aspect, an embodiment of the present disclosure provides a repair method applied to the display substrate, wherein the repair method comprises: when first c stages of driving circuits included in the driving module in the display substrate are cut off, controlling the connection line to be electrically connected to the initial voltage line, and controlling the connection line to be electrically connected to an input terminal of a first predetermined driving circuit included in the driving module; the first predetermined driving circuit is a (c+1)th stage of driving circuit to a (c+a)th stage of driving circuit; both c and a are positive integers.

Optionally, the driving circuit further includes a reset control terminal and at least one clock signal line; the reset control terminal of the nth stage of driving circuit included in the driving module is electrically connected to an output terminal of an (n+b)th stage of driving circuit included in the driving module through a reset cascade line; n and b are positive integers; the repair method includes: when the reset cascade line is disconnected, controlling electrical connection between the connection line and the reset cascade line, and controlling electrical connection between the connection line and a corresponding clock signal line.

Optionally, the driving circuit further includes a reset control terminal and at least one clock signal line; the reset control terminal of the nth stage of driving circuit included in the driving module is electrically connected to an output terminal of an (n+b)th stage of driving circuit included in the driving module through a reset cascade line; b is a positive integer; the repair method includes: when it is detected that the reset cascade line is short-circuited, cutting off a short-circuit point between the reset cascade line and other signal lines; controlling electrical connection between the connection line and the reset cascade line, and controlling electrical connection between the connection line and a corresponding clock signal line.

Optionally, the repair method further includes: selecting the corresponding clock signal line according to a timing of the reset control signal that the reset control terminal needs to access, so that when the driving signal provided by the driving signal terminal included in the nth stage of driving circuit needs to be reset, providing, by the corresponding clock signal line, a valid clock signal.

In a third aspect, an embodiment of the present disclosure provides a display device including the display substrate.

DETAILED DESCRIPTION

Figure 1A:
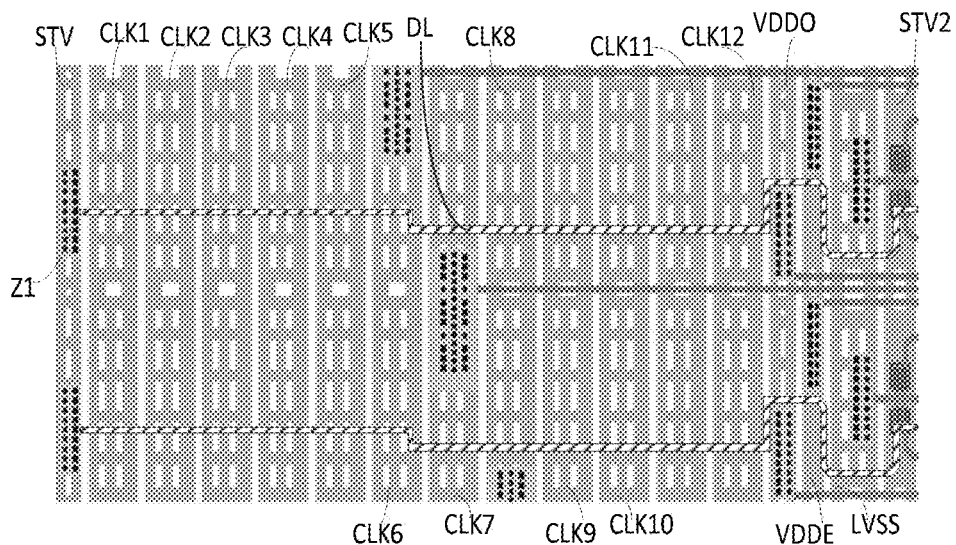
FIG. 1A is a layout diagram of clock signal lines included in the display substrate according to at least one embodiment of the present disclosure.

The following will clearly and completely describe the technical solutions in the embodiments of the present disclosure with reference to the accompanying drawings in the embodiments of the present disclosure. Obviously, the described embodiments are only some of the embodiments of the present disclosure, not all of them. Based on the embodiments in the present disclosure, all other embodiments obtained by persons of ordinary skill in the art without making creative work belong to the protection scope of the present disclosure.

The transistors used in all embodiments of the present disclosure may be thin film transistors or field effect transistors or other devices with the same characteristics. In the embodiments of the present disclosure, in order to distinguish the two electrodes of the transistor except the gate electrode, one electrode is called the first electrode, and the other electrode is called the second electrode.

In actual operation, when the transistor is a thin film transistor or a field effect transistor, the first electrode may be a drain electrode, and the second electrode may be a source electrode; or, the first electrode may be a source electrode, and the second electrode may be a drain electrode.

The display substrate described in the embodiment of the present disclosure includes a base substrate and a driving module arranged on the base substrate; the driving module includes N driving circuits connected in series; the driving circuit includes an input terminal; N is a positive integer;

Input terminals of first a stages of driving circuits included in the driving module are electrically connected to an initial voltage line; a is a positive integer;

An input terminal of an nth stage of driving circuit included in the driving module is electrically connected to an output terminal of an (n–m)th stage of driving circuit included in the driving module through an input cascade line; n and m are positive integers, and m is less than n;

The driving module further includes at least one connection line, and the connection line extends along a first direction;

There is an overlapping portion between an orthographic projection of the connection line on the base substrate and an orthographic projection of the initial voltage line on the base substrate; there is an overlapping portion between the orthographic projection of the connection line on the base substrate and an orthographic projection of the input cascade line on the base substrate.

In the embodiment of the present disclosure, when first c stages of driving circuits of the driving module in the display substrate are cut off, the connection line is controlled to be electrically connected to the initial voltage line, and the connection line is controlled to be electrically connected to the input terminal of a first predetermined driving circuit included in the driving module;

Wherein, the first predetermined driving circuit is a (c+1) th stage of driving circuit to a (c+a)th stage of driving circuit; c is a positive integer.

In at least one embodiment of the present disclosure, the input cascade line is a cascade line between the input terminal of the nth stage of driving circuit included in the driving module and the output terminal of the (n–m)th stage of driving circuit included in the driving module. The output terminal of the (n–m)th stage of driving circuit included in the driving module provides an input signal to the input terminal of the nth stage of driving signal through the input cascade line.

During specific implementation, there is an overlapping portion between the orthographic projection of the connection line on the base substrate and the orthographic projection of the initial voltage line on the base substrate, and there is an overlapping portion between the orthographic projection of the connection line on the base substrate and the orthographic projections of the input cascade line on the base substrate, so that when the first c stages of driving circuit are cut off, the electrical connection between the connection line and the initial voltage line can be controlled by welding or other means, and control the connection line to be electrically connected to a predetermined input cascade line, and the predetermined input cascade line is electrically connected to the input terminal of the first predetermined driving circuit, so that the initial voltage line is electrically connected to the input terminal of the first predetermined driving circuit.

In at least one embodiment of the present disclosure, the initial voltage line includes a portion extending along a second direction, and the initial signal on the initial voltage line is transmitted from a side close to an Nth stage of driving circuit in the driving module to a side close to the first stage of driving circuit in the driving module; the second direction is the direction from the Nth stage of driving circuit to the first stage of driving circuit.

In at least one embodiment of the present disclosure, the first direction may intersect the second direction.

In at least one embodiment of the present disclosure, the driving module may be a gate driving module, and the driving circuit may be a gate driving circuit, but not limited thereto.

In specific implementation, the initial voltage is output by the timing controller (TCON) and then output to the initial voltage line through the level shifter. TCON is set in the driver IC, and the initial voltage line extends from the driver IC to a side away from the driver IC.

In at least one embodiment of the present disclosure, at least some of the connection lines are located on different layers from the initial voltage line, and at least some of the connection lines are located on different layers from the input cascade line.

In a specific implementation, at least part of the connection lines and the initial voltage lines are located on different layers, so that when the repair is required, the connection line can be electrically connected to the initial voltage line by welding or other means; at least part of connection lines and the input cascade line are located on different layers, so that when the repair is required, the connection line can be electrically connected to the input cascade line by welding or other means, so that after the display substrate is cut horizontally, the input terminals of the (c+1)th stage of driving circuit to the (c+a)th stage of driving circuit included in the driving module can all be electrically connected to the initial voltage line.

In FIG. 1A, the one labeled STV is the initial voltage line. It should be noted that the number of initial voltage lines can be one or more, and this is not limited. For example, there are two initial voltage lines. The driving circuit corresponding to an odd row is connected to one initial voltage line, the driving circuit corresponding to an even row is connected to the other initial voltage line. The figure shows an initial voltage line as an example. The one labeled STV2 is the initial signal line, and the one labeled CLK1 is the first clock signal line, the one labeled CLK2 is the second clock signal line, the one labeled CLK3 is the third clock signal line, the one labeled CLK4 is the fourth clock signal line, and the one labeled CLK5 is the fifth clock signal line, the one labeled CLK6 is the sixth clock signal line, the one labeled CLK7 is the seventh clock signal line, the one labeled CLK8 is the eighth clock signal line, the one labeled CLK9 is the ninth clock signal line, the one labeled CLK10 is the tenth clock signal line, the one labeled CLK11 is the eleventh clock signal line, and the one labeled CLK12 is the twelfth clock signal line;

The one labeled VDDO is the first control voltage line, the one labeled VDDE is the second control voltage line, and the one labeled LVSS is the second low voltage line.

In at least one embodiment of the present disclosure, STV is used to provide a start signal for the driving module included in the display panel, and STV2 is used to provide a total reset signal for the driving module, and the total reset signal can be a control signal for resetting the pull-up node PU in the driving circuit in the display panel before the display starts or before a frame time starts.

In at least one embodiment shown in FIG. 1A, the connection line DL includes a first transition portion Z1; an orthographic projection of the first transition portion on the base substrate and an orthographic projection of the initial voltage line on the base substrate are at least partially overlapped; when the initial voltage line STV needs to be electrically connected to the connection line DL, the electrical connection between the first transition portion Z1 and the initial voltage line STV can be controlled by welding or other means, it should be noted that in this case, the connection line and the initial voltage line can be electrically connected in advance through an electrode layer, that is, one terminal of the connection line is electrically connected to the initial voltage line in the initial state. After subsequent cutting, the connection line and the cascading line can also be electrically connected through welding, that is one terminal of the connection line is not electrically connected to the initial voltage line in the initial state. After the subsequent cutting, the electrical connection between one terminal of the connection line and the initial voltage line is realized by welding, and the connection line and the initial voltage line are electrically connected through welding.

In at least one embodiment of the present disclosure, the connection line DL may not use the first transition portion Z1, but there is an overlapping area between the orthographic projection of the connection line segment included in the connection line DL on the base substrate and the orthographic projection of the initial voltage line STV on the base substrate, so as to control the electrical connection between the connection line DL and the initial voltage line through welding and so on when necessary.

Figure 1B:
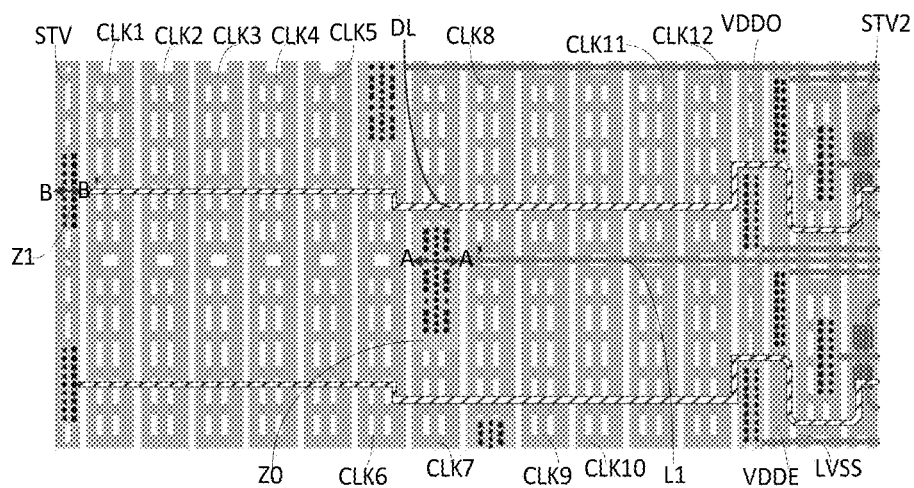
FIG. 1B is a schematic diagram of A-A' section line and B-B' section line added on the basis of FIG. 1A.

FIG. 1B is a schematic diagram of A-A' section line and B-B' section line added on the basis of FIG. 1A.

In FIG. 1B, the one labeled L1 is the first signal line formed on the source-drain metal layer, and the one labeled Z0 is the connecting transition portion.

In at least one embodiment shown in FIG. 1B, the first signal line L1 and the transition line formed on the source-drain metal layer form an integral structure, and the orthographic projection of the transition line on the base substrate partially overlaps the orthographic projection of the seventh clock signal line CLK7 on the base substrate, and a line width of the transition line is larger than a line width of the first signal line L1, so that the first signal line L1 is electrically connected to the seventh clock signal line CLK7 through the connection transition portion Z0.

In at least one embodiment shown in FIG. 1B, the first signal line L1 extends horizontally, and the transition line integrally formed with the first signal line L1 may extend vertically, but not limited thereto.

Figure 1C:
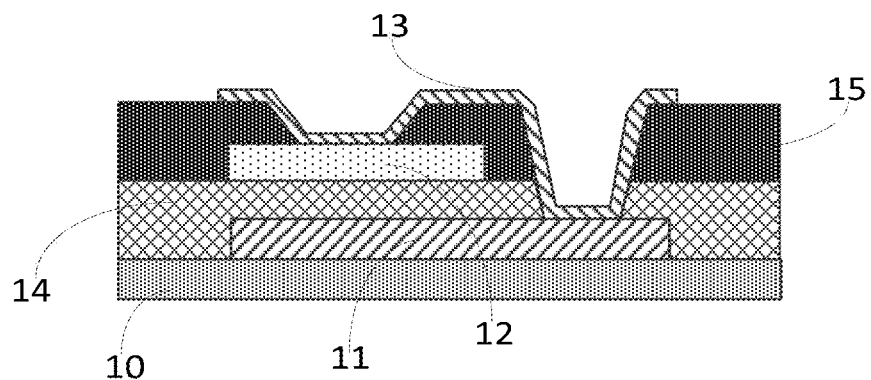
FIG. 1C is A-A' sectional view in FIG. 1B.

FIG. 1C is an A-A' sectional view of FIG. 1B. In FIG. 1C, the one labeled 10 is the base substrate, the one labeled 11 is the gate metal layer, the one labeled 12 is the source-drain metal layer, the one labeled 13 is the electrode layer, and the one labeled 14 is the first insulating layer, the one labeled 15 is the second insulating layer.

As shown in FIG. 1C, the first signal line L1 formed on the source-drain metal layer 12 is electrically connected to the clock signal line formed on the gate metal layer 11 through the via hole and the transition portion formed on the electrode layer 13.

Figure 1D:
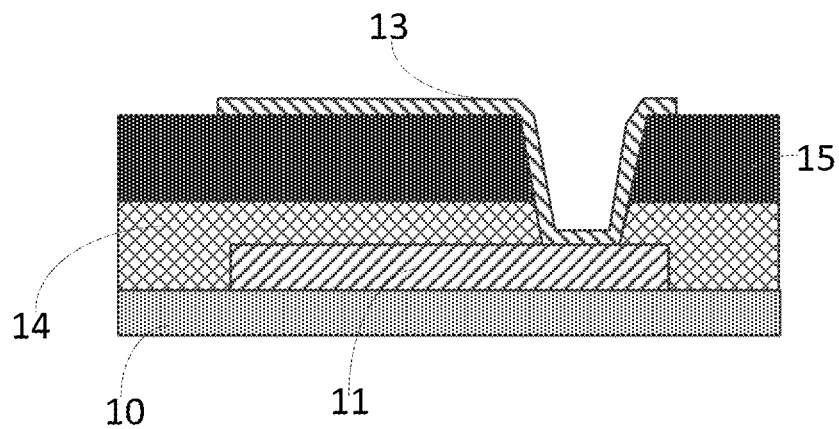
FIG. 1D is B-B'sectional view of FIG. 1B in one case.
Figure 1E:
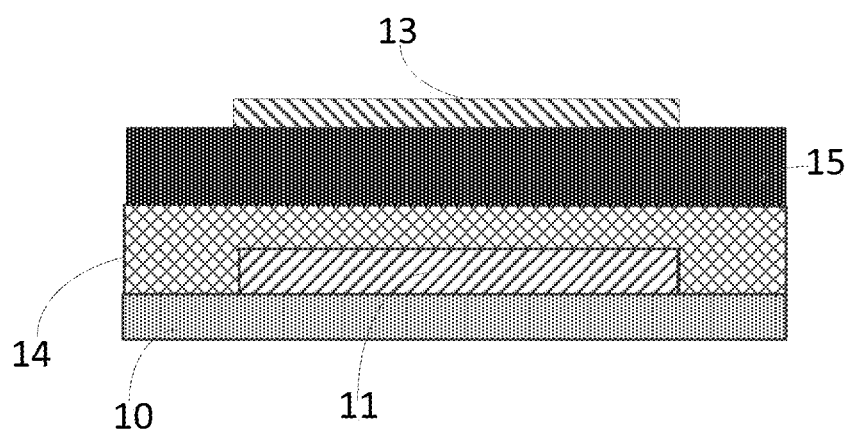
FIG. 1E is B-B' sectional view of FIG. 1B in another case.

FIG. 1D is a cross-sectional view of B-B' of FIG. 1B in one case; FIG. 1E is a cross-sectional view of B-B' of FIG. 1B in another case.

In FIG. 1D and FIG. 1E, the one labeled 10 is the base substrate, the one labeled 11 is the gate metal layer, the one labeled 13 is the electrode layer, the one labeled 14 is the first insulating layer, and the one labeled 15 is the second insulating layer.

As shown in FIG. 1D, the connection line DL formed on the electrode layer 13 is electrically connected to the initial voltage line STV formed on the gate metal layer 11 through a via hole.

As shown in FIG. 1E, there is an overlapping portion between the orthographic projection of the connection line DL formed on the electrode layer 13 on the base substrate 10 and the orthographic projection of the initial voltage line STV formed on the gate metal layer on the base substrate 10.

Figure 2:
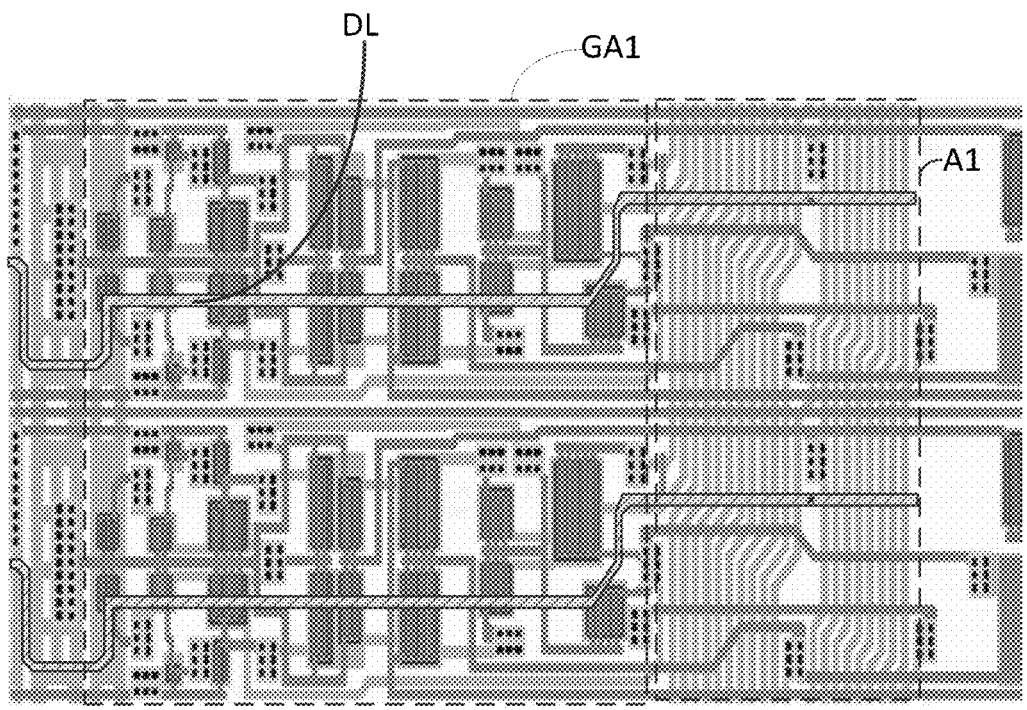
FIG. 2 is a layout diagram of the first driving circuit portion and the line collection portion of the driving module included in the display substrate according to at least one embodiment of the present disclosure.

In FIG. 2, the one labeled DL is the connection line, and the one labeled A1 is a line collection area, a part of the vertically extended signal lines arranged in the line collection area A1 may include input cascade lines, further, a part of the vertically extended signal lines in the line collection area A1 may also include reset cascade lines.

As shown in FIG. 2, there is an overlapping portion between the orthographic projection of the connection line DL on the base substrate and the orthographic projection of the vertically extended signal line arranged in the line collection area A1 on the base substrate.

Optionally, the connection line is arranged between two adjacent driving circuits; or, the connection line penetrates through at least part of the driving circuit. It should be noted that the connection line being arranged between two adjacent driving circuits may include the situation that the connection line is arranged between two driving circuits and does not overlap with the two driving circuits, it also includes the situation that it partially overlaps one of the driving circuits, and it also includes the situation that it overlaps with the one and the other of the driving circuit portions at the same time. The overlapping here refers to overlapping with transistors or signal lines included in the driving circuit.

In a specific implementation, the connection line may be arranged between two adjacent driving circuits, or, as shown in FIG. 1A and FIG. 2, the connection line may penetrate through at least part of the driving circuit.

Figure 3:
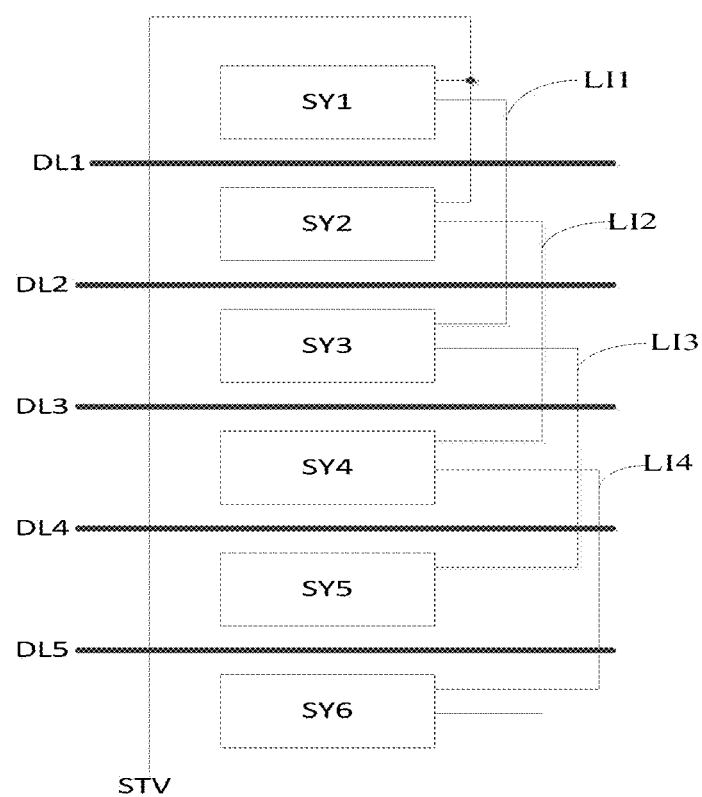
FIG. 3 is a structural diagram of a driving module in a display substrate according to at least one embodiment of the present disclosure.

As shown in FIG. 3, the driving circuit labeled SY1 is the first stage of driving circuit, the driving circuit labeled SY2 is the second stage of driving circuit, the driving circuit labeled SY3 is the third stage of driving circuit, and the driving circuit labeled SY4 is the fourth stage of driving circuit, the one labeled SY5 is the fifth stage of driving circuit, and the one labeled SY6 is the sixth stage of driving circuit.

In at least one embodiment shown in FIG. 3, the one labeled STV is the initial voltage line, A first connection line DL1 is arranged between SY1 and SY2, a second connection line DL2 is arranged between SY2 and SY3, a third connection line DL3 is arranged between SY3 and SY4, a fourth connection line DL3 is arranged between SY4 and SY5, and a fifth connection line DL5 is arranged between SY5 and SY6.

There is an overlapping area between the orthographic projection of each connection line on the base substrate and the orthographic projection of the initial voltage line STV on the base substrate;

Both the input terminal of SY1 and the input terminal of SY2 are electrically connected to the initial voltage line STV;

The input terminal of SY3 is electrically connected to the output terminal of SY1 through the first input cascade line LI1;

The input terminal of SY4 is electrically connected to the output terminal of SY2 through the second input cascade line LI2;

The input terminal of SY5 is electrically connected to the output terminal of SY3 through the third input cascade line LI3;

The input terminal of SY6 is electrically connected to the output terminal of SY4 through the fourth input cascade line LI4;

There is an overlapping area between the orthographic projection of DL1 on the base substrate and the orthographic projection of LI1 on the base substrate;

There is an overlapping area between the orthographic projection of DL2 on the base substrate and the orthographic projection of LI1 on the base substrate, and there is an overlapping area between the orthographic projection of DL2 on the base substrate and the orthographic projection of LI2 on the base substrate;

There is an overlapping area between the orthographic projection of DL3 on the base substrate and the orthographic projection of LI2 on the base substrate, and there is an overlapping area between the orthographic projection of DL3 on the base substrate and the orthographic projection of LI3 on the base substrate;

There is an overlapping area between the orthographic projection of DL4 on the base substrate and the orthographic projection of LI3 on the base substrate, and there is an overlapping area between the orthographic projection of DL3 on the base substrate and the orthographic projection of LI4 on the base substrate;

There is an overlapping area between the orthographic projection of DL5 on the base substrate and the orthographic projection of LI4 on the base substrate.

It should be noted that the number of initial voltage lines, the number of driving circuits, and the cascading relationship in FIG. 3 are schematic illustrations, and the specific number and cascading relationship can be set according to actual conditions.

It should be noted that in this case, connection lines can be set between adjacent two stages of driving circuits, or the display can be divided into areas, and connection lines can be set between some areas. For example, when the driving module includes forty stages of driving circuits (the first stage of driving circuit SY1 to the fortieth stage of driving circuit SY40), there may be no connection line between SY1-SY20 (SY20 is the twentieth stage of driving circuit), and there is no connection line between SY21 (SY21 is the 21$^{st}$ stage of driving circuit) and SY40, there is a connection line between SY20 and SY21, that is, the display panel is divided into multiple areas according to actual needs, and each area includes at least two driving circuits, the connection lines are set between areas, the division of specific areas and the number of connection lines can be set according to actual needs, and are not limited here.

When SY1 and SY2 are cut off, the electrical connection between DL2 and STV are controlled by welding and other means, and the electrical connection between DL2 and LI2 is controlled, and the electrical connection between DL2 and LI3 is controlled, so that the initial voltage provided by STV can be written into the input terminal of SY3 and the input terminal of SY4.

In this case, by cutting the large-size display panel into a small-size display panel, that is, the large display panel and the small display panel share a set of design solutions and the same mask, which can reduce the cost of development and mask, such as the small size panel can be realized by cutting without redesigning and new mask. The present disclosure can realize normal display after cutting a large-size panel into a small-size panel.

In at least one embodiment of the present disclosure, the driving module includes a plurality of clock signal lines, a plurality of stages of driving circuits and a line collection portion; the driving circuit includes a first driving circuit portion and a second driving circuit portion;

The plurality of clock signal lines, the first driving circuit portion, the line collection portion and the second driving circuit portion are arranged in sequence along a direction close to the display area;

The input cascading line is arranged in the line collection portion;

The driving circuit includes the first driving circuit portion and the second driving circuit portion.

In specific implementation, the driving module may include a plurality of clock signal lines, a plurality of stages of driving circuits and a line collection portion, the driving circuit may include a first driving circuit portion and a second driving circuit portion, and the plurality of clock signal lines, the first driving circuit portion, the line collection portion and the second driving circuit portion are arranged in sequence along a direction close to the display area.

In FIG. 2, the one labeled GA1 is the first driving circuit portion.

Figure 4:
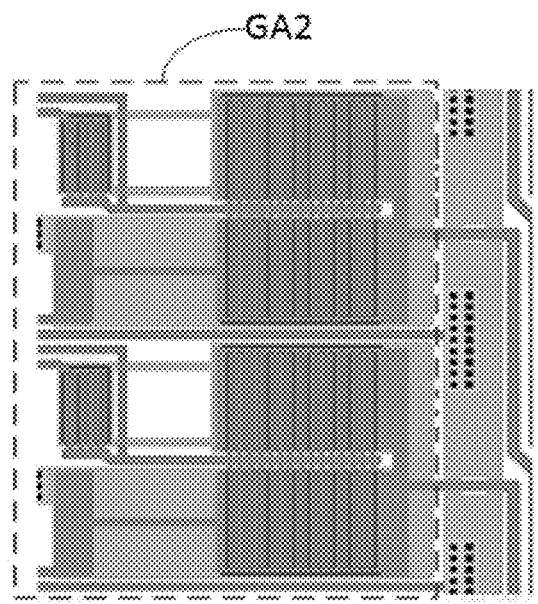
FIG. 4 is a layout diagram of a second driving circuit portion of a driving module included in a display substrate according to at least one embodiment of the present disclosure.

In FIG. 4, the one labeled GA2 is the second driving circuit portion. FIG. 4 is a layout diagram of the second driving circuit portion GA2 according to at least one embodiment of the present disclosure.

Optionally, the second driving circuit portion includes an output transistor in the driving circuit;

The first driving circuit portion includes a pull-up node control sub-circuit, a pull-down node control sub-circuit and an output reset sub-circuit; the pull-up node control sub-circuit is used to control a potential of the pull-up node, and the pull-down node control sub-circuit is used to control a potential of the pull-down node, and the output reset sub-circuit is used to reset the driving signal under the control of the potential of the pull-down node.

In specific implementation, the second driving circuit portion may include a first output transistor and a second output transistor;

A gate electrode of the first output transistor is electrically connected to the pull-up node, a first electrode of the first output transistor is electrically connected to the output clock signal line, and a second electrode of the first output transistor is connected to the driving signal output terminal of the current stage;

A gate electrode of the second output transistor is electrically connected to the pull-up node, a first electrode of the second output transistor is electrically connected to the output clock signal line, and a second electrode of the second output transistor is connected to the carry signal output terminal of the current stage.

In at least one embodiment of the present disclosure, the connection line included in the driving module penetrates through the clock signal line included in the driving circuit, the first driving circuit portion and the line collection portion along a direction from away from the display area to close to the display area.

Optionally, the display panel includes a first metal layer and an electrode layer arranged in sequence in a direction away from the base substrate;

The connection line includes a first line portion formed on the electrode layer and a second line portion formed on the first metal layer; the first line portion is electrically connected to the second line portion;

At least part of the first line portion is arranged in the clock signal line area, the first driving circuit portion and the line collection portion; the clock signal line area is an area where the plurality of clock signal lines are arranged;

At least part of the second line portion is arranged on the line collection portion.

In at least one embodiment of the present disclosure, the electrode layer may be an indium tin oxide (ITO) layer, and the first metal layer may be a source-drain metal layer, but not limited thereto.

In a specific implementation, the connection line may include a first line portion and a second line portion, the first line portion is formed on the first electrode layer, the second line portion is formed on the second electrode layer; at least part of the first line portion is arranged on the clock signal line area, the first driving circuit portion and the line collection portion, at least a part of the second line portion is arranged on the line collection portion, but not limited thereto.

In at least one embodiment of the present disclosure, the display panel includes an electrode layer and a first metal layer arranged on one side of the base substrate;

The connection line is formed by the electrode layer or the first metal layer.

In a specific implementation, the connection lines may also be routed in a single layer, and the connection lines may be formed on the electrode layer or the first metal layer.

Optionally, the driving circuit includes an input circuit; the control terminal of the input circuit and/or the first terminal of the input circuit are electrically connected to the input terminal, and the second terminal of the input circuit is electrically connected to the pull-up node;

The input circuit is used to control the potential of the pull-up node under the control of the input signal provided by the input terminal.

During specific implementation, the control terminal of the input circuit and/or the first terminal of the input circuit may be electrically connected to the input terminal.

Optionally, the input circuit includes a first transistor;

A gate electrode of the first transistor is electrically connected to the first input terminal, a first electrode of the first transistor is electrically connected to the second input terminal, and a second electrode of the first transistor is electrically connected to the pull-up node;

The first input terminal and the second input terminal are electrically connected or not electrically connected.

In a specific implementation, both the first input terminal and the second input terminal may be the driving signal output terminal of an adjacent previous stage, or the first input terminal may be the carry signal output terminal of the adjacent previous stage, the second output terminal may be an driving signal output terminal of an adjacent previous stage, but not limited thereto.

In at least one embodiment of the present disclosure, the input circuit may include a first transistor;

A gate electrode of the first transistor is electrically connected to the input terminal, a first electrode of the first transistor is electrically connected to the high voltage terminal, and a second electrode of the first transistor is electrically connected to the pull-up node.

Optionally, the gate electrode of the first transistor is formed on the second metal layer, and the first electrode of the first transistor is formed on the first metal layer;

The gate electrode of the first transistor is electrically connected to the first connection line portion formed on the second metal layer;

The first electrode of the first transistor is electrically connected to the second connection line portion formed on the second metal layer through a via hole;

The connection line includes a third connection line portion formed on the electrode layer and a fourth connection line portion formed on the first metal layer; the third connection line portion is electrically connected to the fourth connection line portion;

There is an overlapping portion between the orthographic projection of the third connection line portion on the base substrate and the orthographic projection of the first connection line portion on the base substrate; there is an overlapping portion between the orthographic projection of the fourth connection line portion on the base substrate and the orthographic projection of the second connection line portion on the base substrate.

In at least one embodiment of the present disclosure, the second metal layer may be a gate metal layer, but not limited thereto.

In at least one embodiment of the present disclosure, the first connection line portion is electrically connected to an input cascade line arranged in the line collection area, and/or, the second connection line portion is connected to an input cascade line set in the line collection area.

Figure 5:
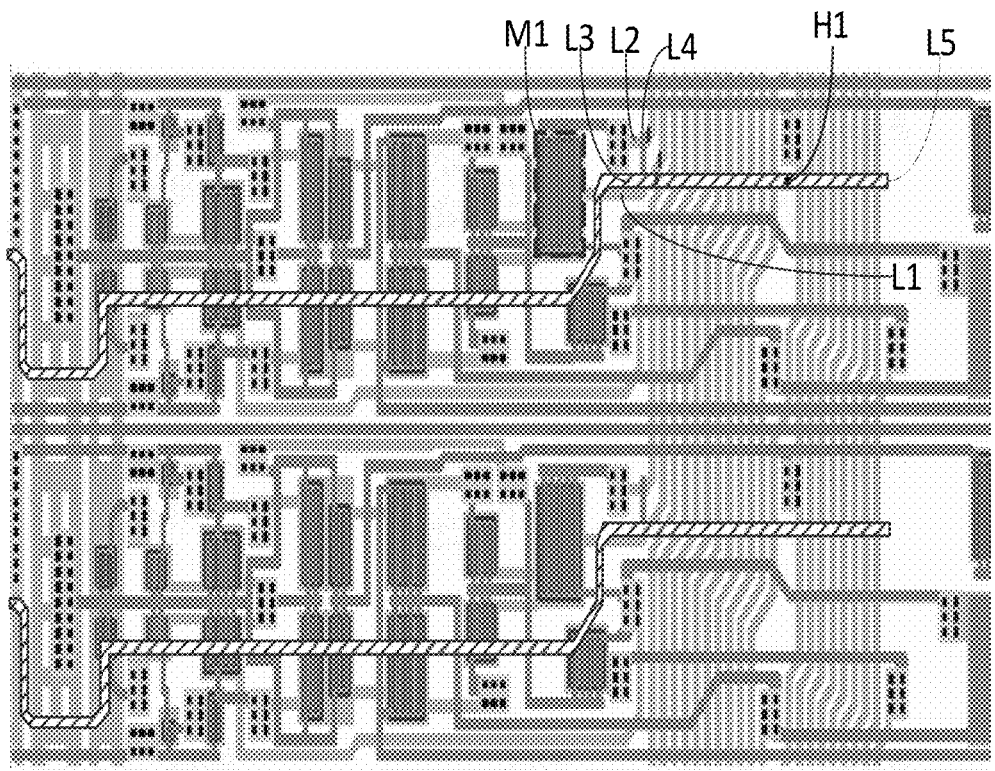
FIG. 5 is a layout diagram of a first driving circuit portion of a driving module included in a display substrate according to at least one embodiment of the present disclosure.
Figure 7:
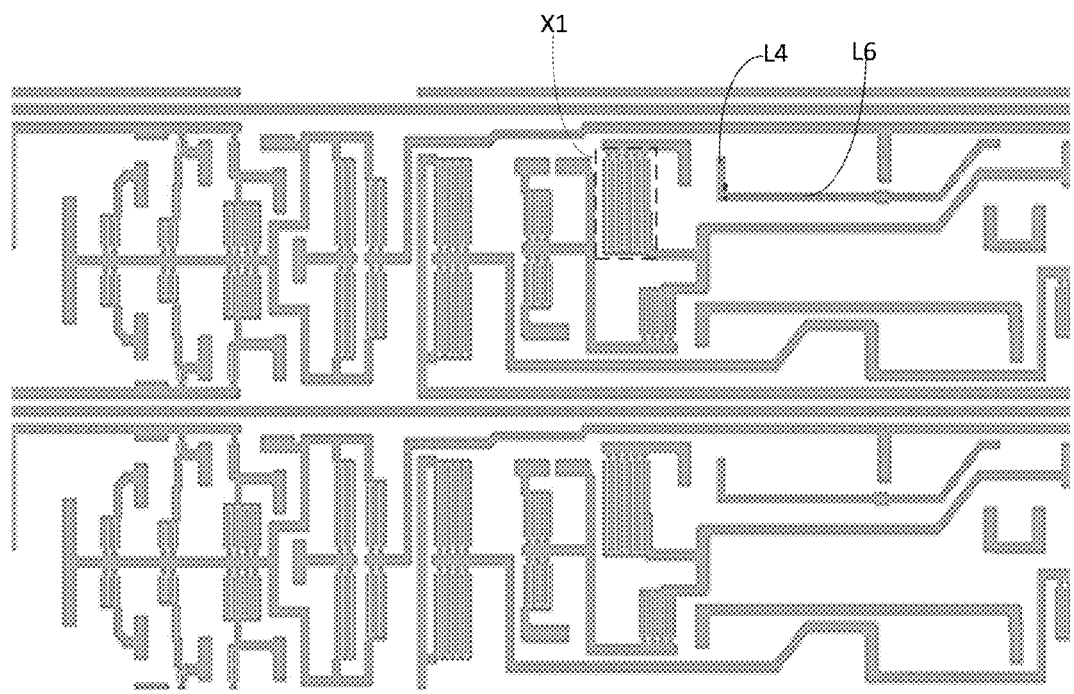
FIG. 7 is a layout diagram of the source-drain metal layers in FIG. 5.

As shown in FIG. 5, the gate electrode G1 of the first transistor M1 is formed on the gate metal layer; the first electrode of the first transistor M1 and the second electrode of the first transistor M1 are formed on the source-drain metal layer, and the gate electrode G1 of the first transistor M1 is electrically connected to the first connection line portion L1 formed on the gate metal layer, and the first electrode of the first transistor M1 is electrically connected to the second connection line portion L2 formed on the gate metal layer through a via hole. Optionally, the first electrode of the first transistor M1 is electrically connected to the second connection line portion L2 through a deposited electrode layer, such as ITO layer, that is, the electrode layer is equivalent to a bridge structure, filled in the via hole, and the gate metal layer and the source-drain metal layer are bridged; the connection line includes a third connection line portion L3 formed on the electrode layer, and a fourth connection line portion L4 formed on the source-drain metal layer. As shown in FIG. 7, the one labeled X1 is the electrode portion of M1, the electrode portion X1 of M1 includes the first electrode of M1 and the second electrode of M1, the first electrode is one of the source electrode or the drain electrode, and the second electrode is the other of the source electrode or the drain electrode.

Figure 6:
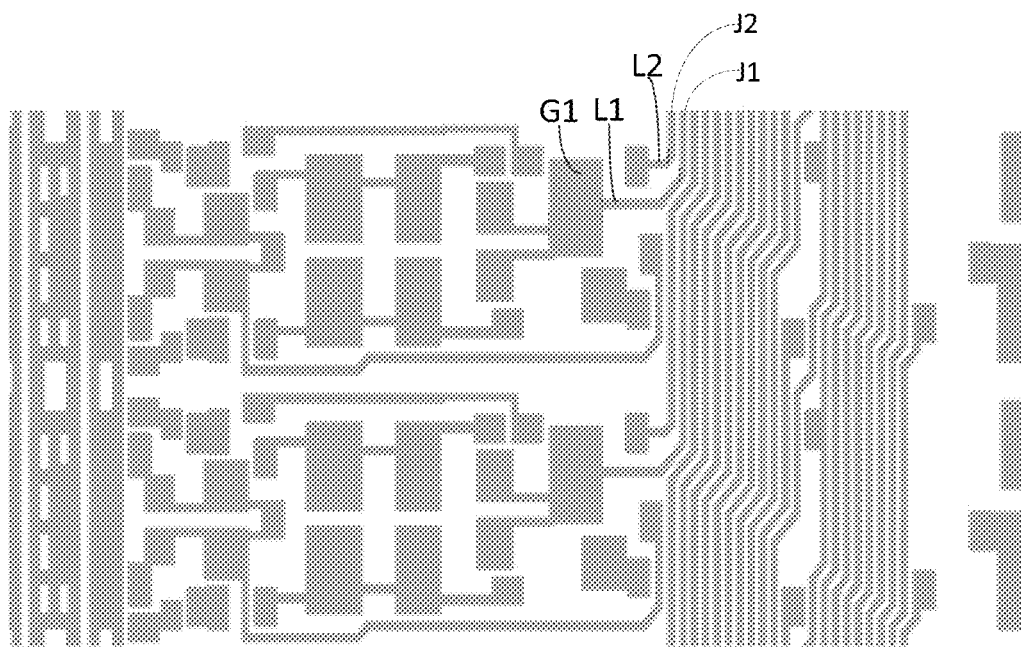
FIG. 6 is a layout diagram of the gate metal layer in FIG. 5.

FIG. 6 is a layout diagram of the gate metal layer in FIG. 5. In FIG. 6, the one labeled G1 is the gate electrode of M1;

FIG. 7 is a layout diagram of the source-drain metal layer in FIG. 5.

In at least one embodiment shown in FIGS. 5-8, the first connection line portion L1 is electrically connected to the first input cascade line J1. Optionally, the first connection line portion L1 and the first input cascade line J1 are arranged at the same layer and made of the same material, the second connection line portion L2 is electrically connected to the second input cascade line J2, optionally, the second connection line portion L2 and the second input cascade line J2 are arranged at the same layer and made of the same material.

Figure 8:
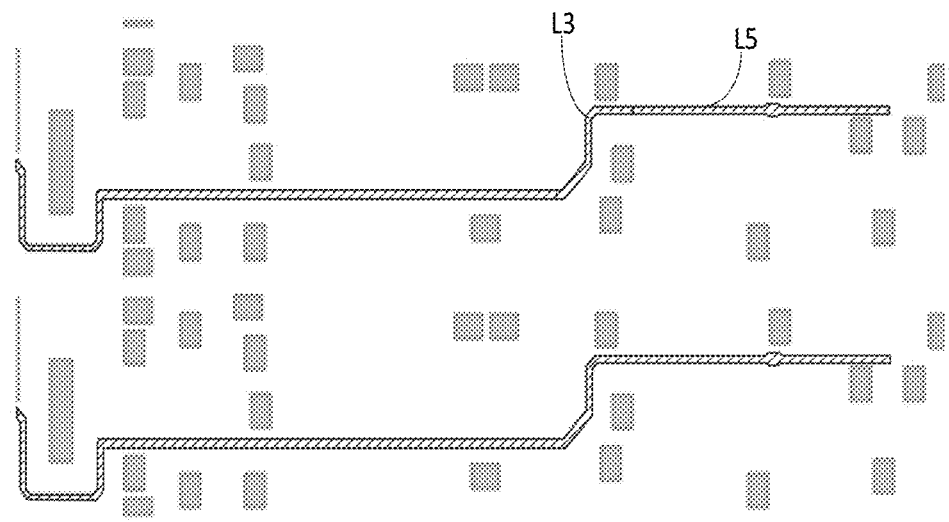
FIG. 8 is a layout diagram of the electrode layer in FIG. 5.
Figure 10:
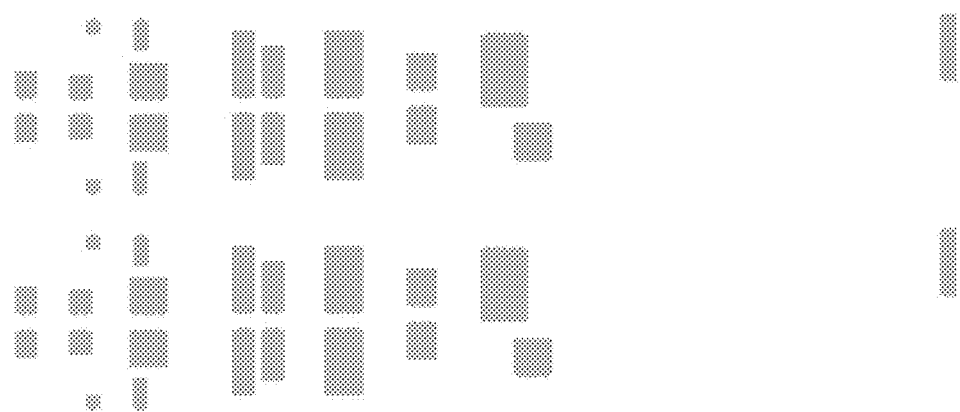
FIG. 10 is a layout diagram of the active layer in FIG. 5.
Figure 11:
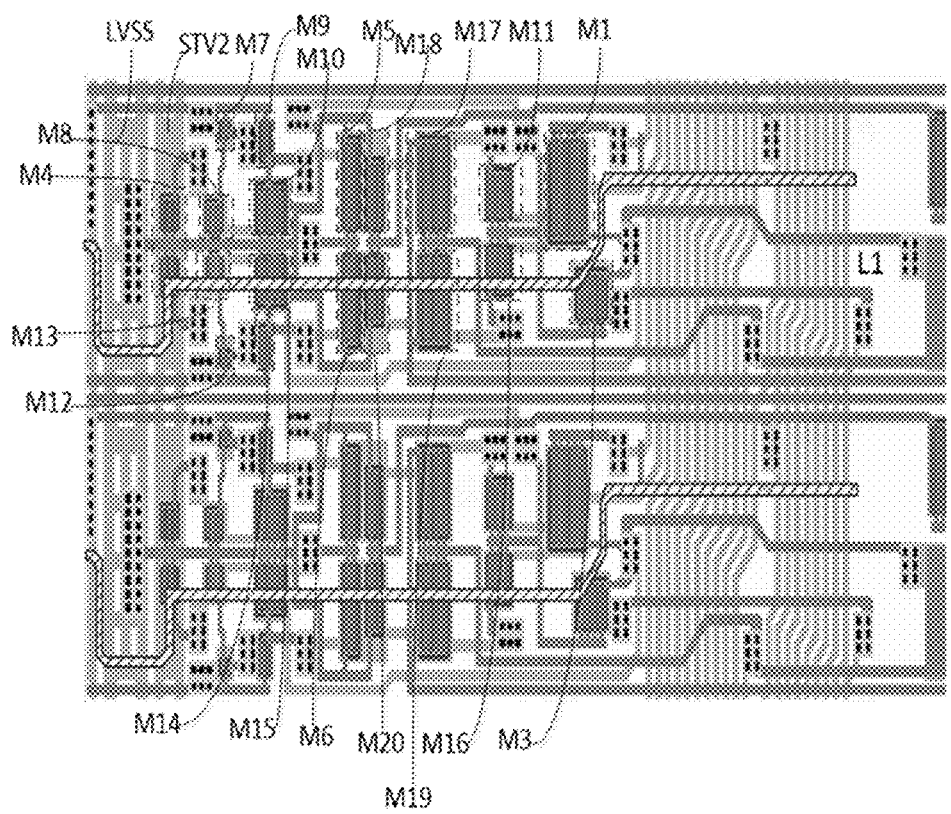
FIG. 11 is a schematic diagram of transistors with labels on the basis of FIG. 5.

FIG. 8 is a layout diagram of the electrode layer in FIG. 5; FIG. 10 is a layout diagram of the active layer in FIG. 5; FIG. 11 is a schematic diagram of the transistors in FIG. 5 added with labels.

As shown in FIG. 5, there is an overlapping portion between the orthographic projection of the third connection line portion L3 on the base substrate and the orthographic projection of the first connection line portion L1 on the base substrate, and there is an overlapping portion between the orthographic projection of the fourth connection line portion L4 on the base substrate and the orthographic projection of the second connection line portion L2 on the base substrate.

The display substrate according to at least one embodiment of the present disclosure further includes a fifth connection line portion and a sixth connection line portion;

The fifth connection line portion is formed on the electrode layer, and the fifth connection line portion is connected to the third connection line portion;

The sixth connection line portion is formed on the first metal layer, and the sixth connection line portion is connected to the fourth connection line portion;

The fifth connection line portion is electrically connected to the sixth connection line portion.

In specific implementation, since the thickness of the electrode layer is relatively thin, the fifth connection line portion formed on the electrode layer and the sixth connection line portion formed on the first metal layer can be used in the line-collection area, and the orthographic projection of the fifth connection line portion on the base substrate may at least partially overlap with the orthographic projection of the sixth connection line portion on the base substrate.

As shown in FIGS. 5-8, the display substrate according to at least one embodiment of the present disclosure further includes a fifth connection line portion L5 and a sixth connection line portion L6;

As shown in FIG. 8, the fifth connection line portion L5 is formed on the electrode layer; the fifth connection line portion L5 is connected to the third connection line portion L3. Optionally, the fifth connection line portion L5 and the third connection line portion L3 are arranged at the same layer and made of the same material;

As shown in FIG. 7, the sixth connection line portion L6 is formed on the source-drain metal layer; the sixth connection line portion L6 is connected to the fourth connection line portion L4. Optionally, the sixth connection line portion L6 and the fourth connection line portion L4 are arranged at the same layer and made of the same material;

As shown in FIGS. 5-8, the fifth connection line portion L5 and the sixth connection line portion L6 are electrically connected through the first via hole H1, and the first via hole H1 is arranged on the insulating layer between the fifth connection line portion L5 and the sixth connection line portion L6, when the fifth connection line portion L5 is deposited, it will fall on the first via hole H1, and then the fifth connection line portion L5 and the sixth connection portion L6 will be electrically connected through the first via hole H1.

In at least one embodiment shown in FIGS. 5-8, both the fifth connection line portion L5 and the sixth connection line portion L6 may be arranged in the line collection area A1, but is not limited thereto.

The display substrate according to at least one embodiment of the present disclosure further includes a fifth connection line portion;

The fifth connection line portion is formed on the electrode layer, and the fifth connection line portion is connected to the third connection line portion.

In a specific implementation, the display substrate may further include a fifth connection line portion formed on the electrode layer, and the fifth connection line portion is connected to the third connection line portion. That is, in at least one embodiment shown in FIG. 5-FIG. 8, the sixth connection line portion formed in the source-drain metal layer may not be provided, and only the fifth connection line portion L5 formed in the electrode layer is provided in the line collection area A1.

Optionally, the gate electrode of the first transistor is formed on the second metal layer, and the first electrode of the first transistor is formed on the first metal layer;

The gate electrode of the first transistor is electrically connected to the first connection line portion formed on the second metal layer;

The first electrode of the first transistor is electrically connected to the second connection line portion formed on the second metal layer through a via hole;

The connection line includes a third connection line portion formed on the electrode layer;

There is an overlapping portion between the orthographic projection of the third connection line portion on the base substrate and the orthographic projection of the first connection line portion on the base substrate; there is an overlapping portion between the orthographic projection of the third connection line portion on the base substrate and the orthographic projection of the second connection line portion on the base substrate.

In a specific implementation, the gate electrode of the first transistor may be formed on the gate metal layer, and the first electrode of the first transistor may be formed on the source-drain metal layer;

The gate electrode of the first transistor is electrically connected to the first connection line portion formed on the gate metal layer, and the first electrode of the first transistor is electrically connected to the second connection line portion formed on the gate metal layer through a via hole;

The connection line includes a third connection line portion formed on the electrode layer.

Figure 9:
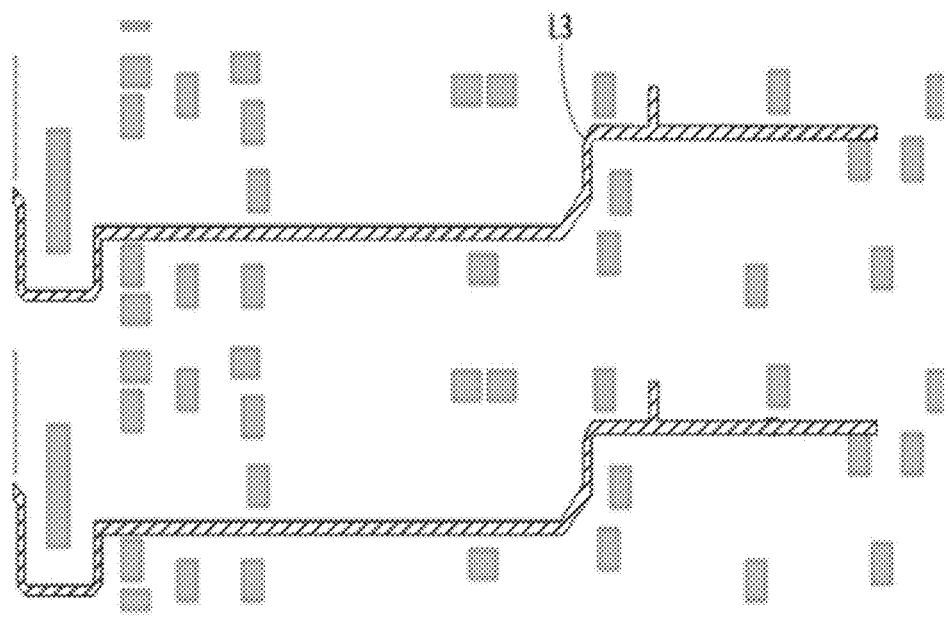
FIG. 9 is a layout diagram of the electrode layer in the first driving circuit portion of the driving module included in the display substrate according to at least one embodiment of the present disclosure.

In at least one embodiment of the present disclosure, as shown in FIG. 9, the connection line may include a third connection line portion L3 formed on the electrode layer. There is an overlapping portion between the orthographic projection of the third connection line portion L3 on the base substrate and the orthographic projection of the first connection line portion L1 on the base substrate in FIG. 6; there is an overlapping portion between the orthographic projection of the third connection line portion L3 on the base substrate and the orthographic projection of the second connection line portion L2 on the base substrate in FIG. 6, that is, the connection line layers are all made of electrode layers.

In at least one embodiment of the present disclosure, the gate electrode of the first transistor is electrically connected to the first electrode of the first transistor;

There is an overlapping portion between the orthographic projection of the connection line on the base substrate and the orthographic projection of the gate electrode of the first transistor on the base substrate; or, There is an overlapping portion between the orthographic projection of the connection line on the base substrate and the orthographic projection of the first electrode of the first transistor on the base substrate.

In specific implementation, the gate electrode of the first transistor and the first electrode of the first transistor can be electrically connected to each other, so that the orthographic projection of the connection line on the base substrate may only have an overlapping portion with the orthographic projection of the gate electrode of the first transistor on the base substrate, or, the orthographic projection of the connection line on the base substrate may only have an overlapping portion with the orthographic projection of the first electrode of the first transistor on the base substrate, the repair can be realized.

Figure 12:
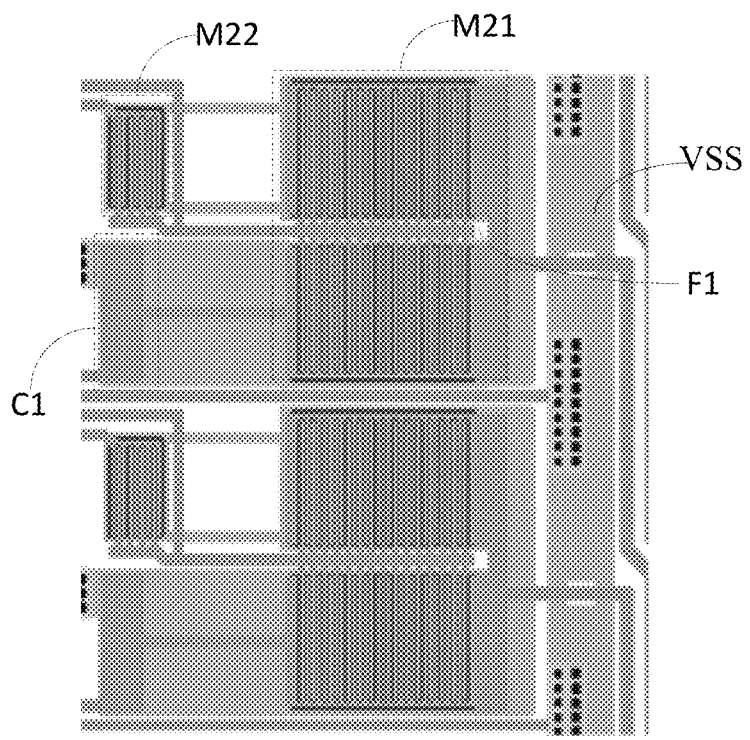
FIG. 12 is a layout diagram of the second driving circuit portion.

FIG. 12 is a layout diagram of the second driving circuit portion.

In FIG. 12, the one labeled M21 is the twenty-first transistor, the one labeled M22 is the twenty-second transistor, the one labeled C1 is the first capacitor, and the one labeled F1 is a groove arranged between the first electrode of the twenty-first transistor M21 and the second electrode of the twenty-first transistor M21, and the groove F1 can prevent connection or short circuit between the first electrode of M21 and the second electrode of M21.

Figure 13:
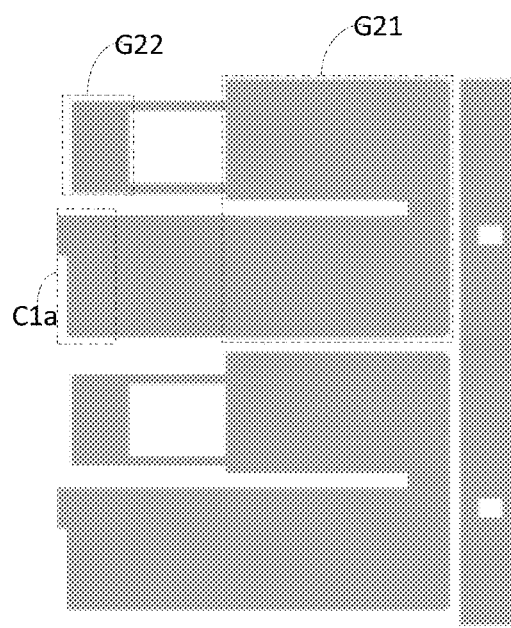
FIG. 13 is a layout diagram of the gate metal layer in FIG. 12.

FIG. 13 is a layout diagram of the gate metal layer in FIG. 12, wherein G21 is the gate electrode of M21, G22 is the gate electrode of M22, and C1a is the first electrode plate of C1.

As shown in FIG. 13, C1a and G21 are connected, and C1a and G21 are arranged at the same layer and made of the same material.

Figure 14:
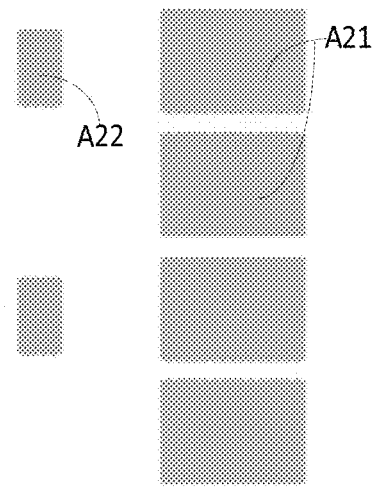
FIG. 14 is a layout diagram of the active layer in FIG. 12.

FIG. 14 is a layout diagram of an active layer in FIG. 12. In FIG. 14, the one labeled A21 is the active layer pattern of M21, and the one labeled S22 is the active layer pattern of M22.

Figure 15:
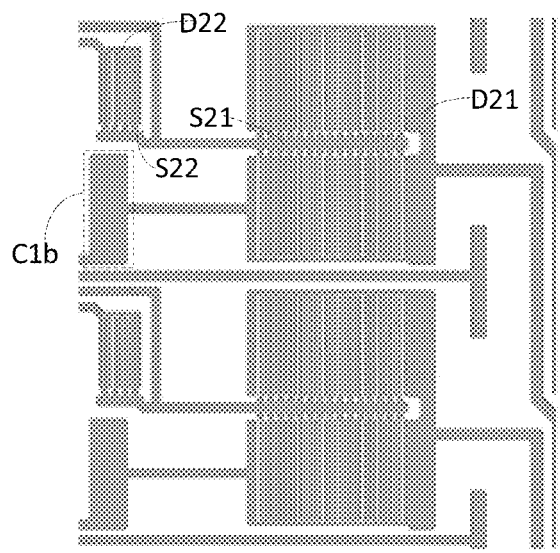
FIG. 15 is a layout diagram of the source-drain metal layers in FIG. 12.

FIG. 15 is a layout diagram of the source-drain metal layer in FIG. 12.

In FIG. 15, the one labeled S21 is the first electrode of M21, the one labeled D21 is the second electrode of M21, the one labeled S22 is the first electrode of M22, the one labeled D22 is the second electrode of M22. C1b is the second electrode plate of C1, and C1b and the source-drain layer are arranged at the same layer and made of the same material.

As shown in FIG. 15, there is connection between C1b and D21.

Figure 16:
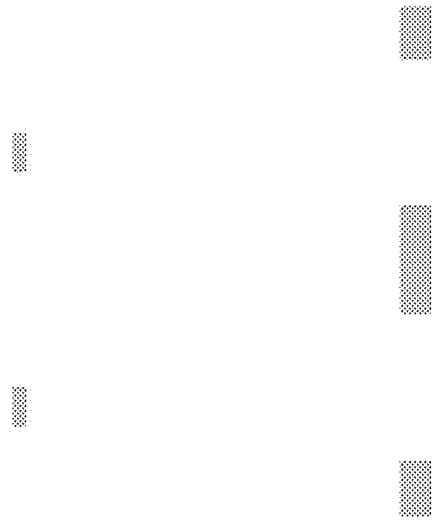
FIG. 16 is a layout diagram of the electrode layer in FIG. 12.

FIG. 16 is a layout diagram of the electrode layers in FIG. 12, where the electrode layer on the left side of FIG. 16 is used to electrically connect the gate signal of M21 to the signal line corresponding to the PU, and the electrode layer on the right side of FIG. 16 is used to transmit the signal provided by a low-voltage line VSS to the noise reduction transistor in the driving circuit. For example, referring to FIG. 22, the first low-voltage terminal VSS is electrically connected to one electrode of M17 to reduce noise for the driving signal output terminal GO of the current stage.

In at least one embodiment of the present disclosure, the plurality of clock signal lines in FIG. 1, the first driving circuit portion and the line collection portion in FIG. 5, and the second driving circuit portion in FIG. 12 are arranged in sequence along the direction close to the display area.

Optionally, the driving circuit further includes an output reset circuit and at least one clock signal line;

A control terminal of the output reset circuit is electrically connected to the reset control terminal, a first terminal of the output reset circuit is electrically connected to the driving signal output terminal of the current stage, and a second terminal of the output reset circuit is electrically connected to the first voltage line, the output reset circuit is used to control to connect the driving signal output terminal of the current stage and the first voltage line under the control of the reset control signal provided by the reset control terminal;

There is an overlapping portion between the orthographic projection of the connection line on the base substrate and the orthographic projection of the clock signal line on the base substrate;

The control terminal of the output reset circuit is electrically connected to the seventh connection line portion;

There is an overlapping portion between the orthographic projection of the connection line on the base substrate and the orthographic projection of the seventh connection line portion on the base substrate.

In at least one embodiment of the present disclosure, when the driving circuit is the nth-stage of driving circuit included in the driving module, the control terminal of the output reset circuit can be electrically connected to the output terminal of the (n+b)th stage of driving circuit included in the driving module through a reset cascade line, and the reset cascaded line can be arranged in the line collection area; wherein, both n and b are positive integers.

In specific implementation, the driving circuit may also include an output reset circuit and at least one clock signal line; the output reset circuit is used to control to electrically connect the driving signal output terminal of the current stage and the first voltage line under the control of the reset control signal; there is an overlapping area between the orthographic projection of the connection line on the base substrate and the orthographic projection of the clock signal line on the base substrate;

The control terminal of the output reset circuit is electrically connected to the seventh connection line portion; there is an overlapping portion between the orthographic projection of the connection line on the base substrate and the orthographic projection of the seventh connection line portion on the base substrate.

In at least one embodiment of the present disclosure, the seventh connection line portion may be formed in the gate metal layer, but not limited thereto.

In at least one embodiment of the present disclosure, the seventh connection line portion may be arranged in the line collection area, and the seventh connection line portion may be integrally formed with a reset cascade line.

Optionally, the output reset circuit includes a reset control terminal and a second transistor;

A gate electrode of the second transistor is electrically connected to the reset control terminal, a first electrode of the second transistor is electrically connected to the driving signal output terminal of the current stage, and a second electrode of the second transistor is electrically connected to the first voltage line;

The reset control terminal of the nth stage of driving circuit is electrically connected to the driving signal output terminal of the (n+p)th stage of driving circuit; p is a positive integer.

As shown in FIG. 1, there is an overlapping portion between the orthographic projection of the connection line DL on the base substrate and the orthographic projection of the first clock signal line CLK1 on the base substrate; there is an overlapping portion between the orthographic projection of the connection line DL on the base substrate and the orthographic projection of the second clock signal line CLK2 on the base substrate; there is an overlapping portion between the orthographic projection of the connection line DL on the base substrate and the orthographic projection of the third clock signal line CLK3 on the base substrate; there is an overlapping portion between the orthographic projection of the connection line DL on the base substrate and the orthographic projection of the fourth clock signal line CLK4 on the base substrate; there is an overlapping portion between the orthographic projection of the connection line DL on the base substrate and the orthographic projection of the fifth clock signal line CLK5 on the base substrate; there is an overlapping portion between the orthographic projection of the connection line DL on the base substrate and the orthographic projection of the sixth clock signal line CLK6 on the base substrate; there is an overlapping portion between the orthographic projection of the connection line DL on the base substrate and the orthographic projection of the seventh clock signal line CLK7 on the base substrate; there is an overlapping portion between the orthographic projection of the connection line DL on the base substrate and the orthographic projection of the eighth clock signal line CLK8 on the base substrate; there is an overlapping portion between the orthographic projection of the connection line DL on the base substrate and the orthographic projection of the ninth clock signal line CLK0 on the base substrate; there is an overlapping portion between the orthographic projection of the connection line DL on the base substrate and the orthographic projection of the tenth clock signal line CLK10 on the base substrate; there is an overlapping portion between the orthographic projection of the connection line DL on the base substrate and the orthographic projection of the eleventh clock signal line CLK11 on the base substrate; there is an overlapping portion between the orthographic projection of the connection line DL on the base substrate and the orthographic projection of the twelfth clock signal line CLK12 on the base substrate.

Figure 17:
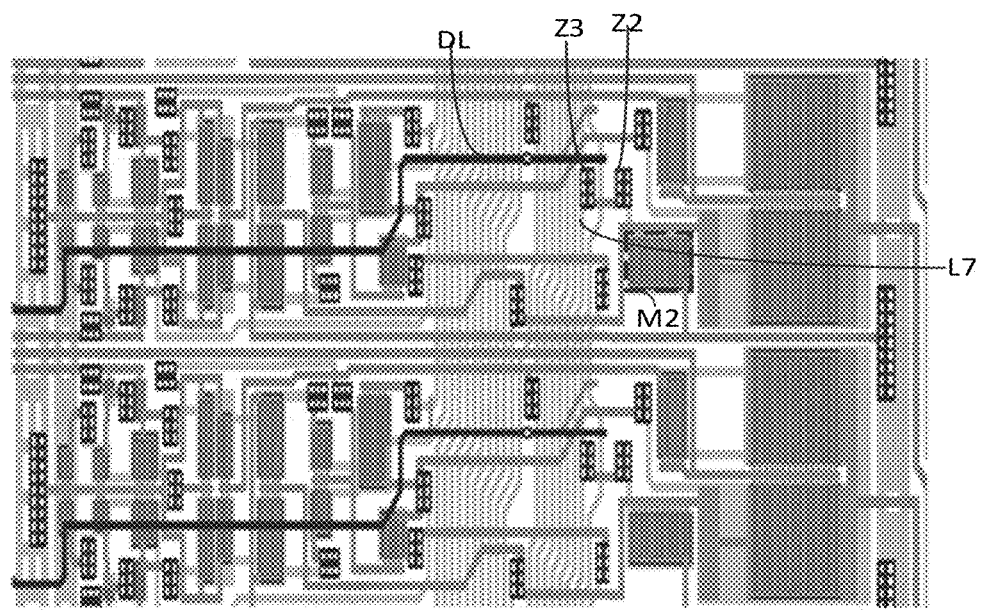
FIG. 17 is a layout diagram of the first driving circuit portion, the line collection portion and the second driving circuit portion of the driving module included in the display substrate according to at least one embodiment of the present disclosure.

As shown in FIG. 17, the gate electrode G2 of the second transistor M2 is electrically connected to the seventh connection line portion L7 through the second transition portion Z2 and the third transition portion Z3, and there is an overlapping portion between the orthographic projection of the connection line DL on the base substrate and the orthographic projection of the seventh connection line portion L7 on the base substrate.

As shown in FIG. 17, the gate electrode of the second transistor M2 is electrically connected to the seventh connection line portion L7 through a via hole.

Figure 18:
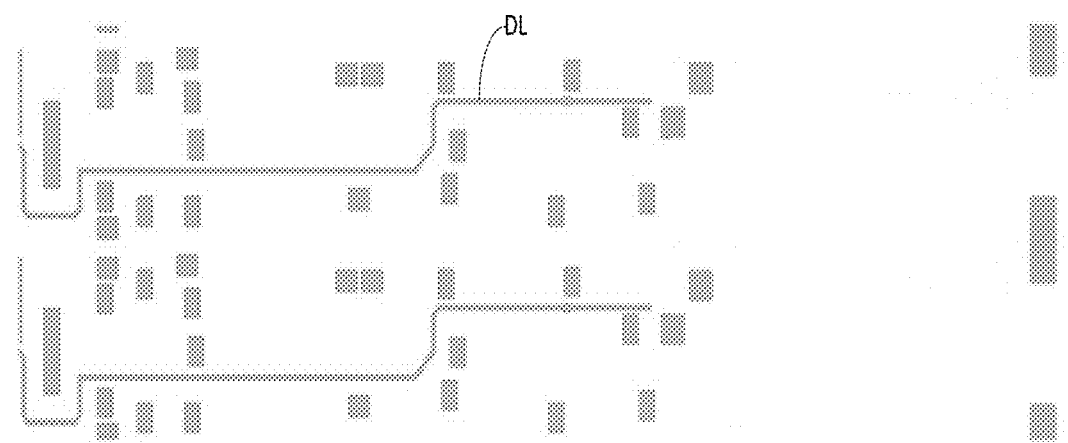
FIG. 18 is a layout diagram of the electrode layer in FIG. 17.
Figure 19:
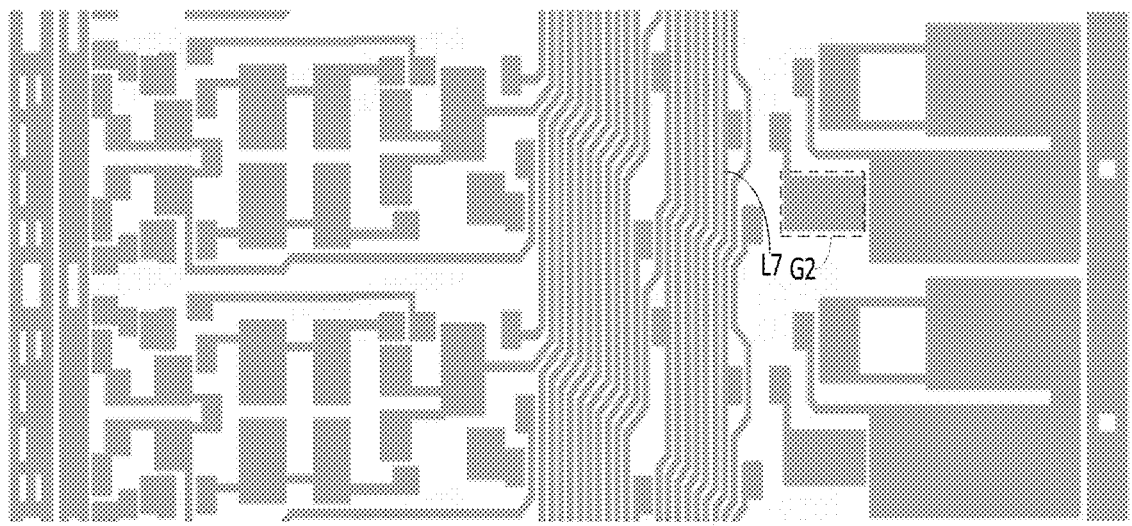
FIG. 19 is a layout diagram of the gate metal layer in FIG. 17.
Figure 20:
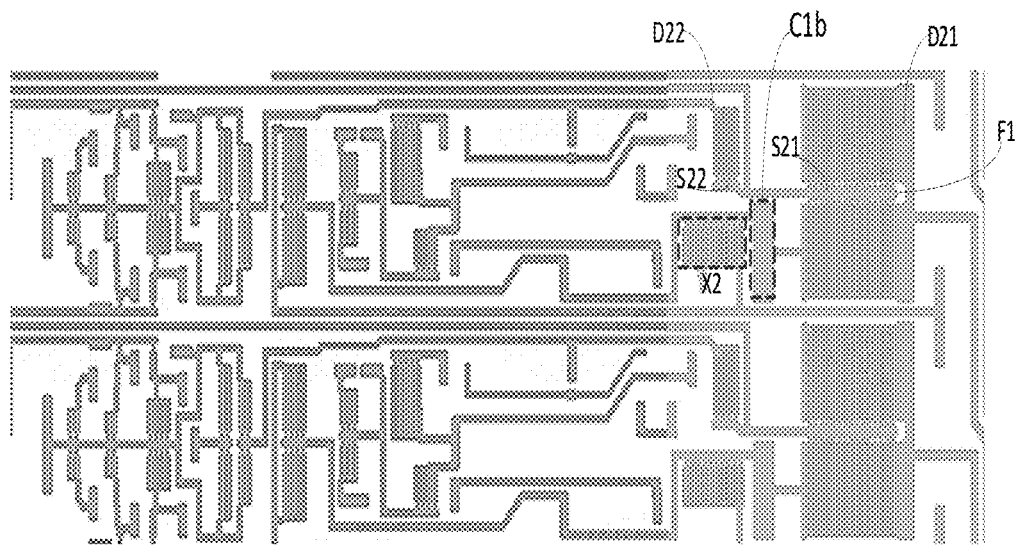
FIG. 20 is a layout diagram of the source-drain metal layers in FIG. 17.
Figure 21:
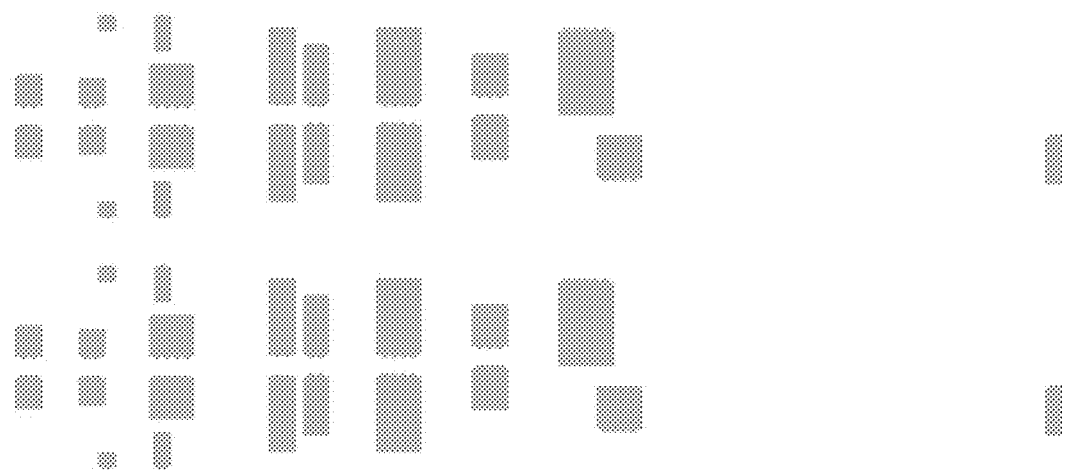
FIG. 21 is a layout diagram of the active layer in FIG. 17.

FIG. 18 is a layout diagram of the electrode layer in FIG. 17, FIG. 19 is a layout diagram of the gate metal layer in FIG. 17, FIG. 20 is a layout diagram of the source-drain metal layer in FIG. 17, and FIG. 21 is a layout diagram of the active layer in FIG. 17.

In FIG. 20, the one labeled X2 is the electrode portion of M2, and the electrode portion X2 of M2 includes the first electrode of M2 and the second electrode of M2.

In at least one embodiment of the present disclosure, the driving circuit includes a first driving circuit portion; the first driving circuit portion includes an input circuit, an output reset circuit, a pull-up node control circuit, a first pull-down node control circuit, a second pull-down node control circuit and a reset circuit;

The input circuit is used to control the potential of the pull-up node under the control of the input signal provided by the input terminal;

The pull-up node control circuit is used to control the potential of the pull-up node;

The first pull-down node control circuit is used to control the potential of the first pull-down node;

The second pull-down node control circuit is used to control the potential of the second pull-down node;

The reset circuit is used to reset the driving signal provided by the driving signal output terminal of the current stage under the control of the potential of the first pull-down node and the potential of the second pull-down node.

In specific implementation, the driving circuit may include a first driving circuit portion, and the first driving circuit portion may include an input circuit, an output reset circuit, a pull-up node control circuit, a first pull-down node control circuit, a second pull-down node control circuit, and a reset circuit, the input circuit controls the potential of the pull-up node under the control of the input signal; the pull-up node control circuit controls the potential of the pull-up node, and the first pull-down node control circuit is used to control the potential of the first pull-down node, the second pull-down node control circuit is used to control the potential of the second pull-down node, and the reset circuit controls to reset the driving signal provided by the driving signal output terminal of the current stage.

In at least one embodiment of the present disclosure, the driving circuit may also only include a pull-down node and a pull-down node control circuit, the pull-down node control circuit is used to control the potential of the pull-down node, and the reset circuit is used to control the potential of the pull-down node under the control of the potential of the pull-down node.

Optionally, the input circuit includes a first transistor;

The gate electrode of the first transistor is electrically connected to the first input terminal, the first electrode of the first transistor is electrically connected to the second input terminal, and the second electrode of the first transistor is electrically connected to the pull-up node;

The pull-up node control circuit includes a third transistor, a fourth transistor, a fifth transistor and a sixth transistor;

a gate electrode of the third transistor is electrically connected to the reset terminal, a first electrode of the third transistor is electrically connected to the pull-up node, and a second electrode of the third transistor is electrically connected to the second voltage line;

a gate electrode of the fourth transistor is electrically connected to the initial signal line, a first electrode of the fourth transistor is electrically connected to the pull-up node, and a second electrode of the fourth transistor is electrically connected to the second voltage line;

a gate electrode of the fifth transistor is electrically connected to the first pull-down node, a first electrode of the fifth transistor is electrically connected to the pull-up node, and a second electrode of the fifth transistor is electrically connected to the second voltage line;

a gate electrode of the sixth transistor is electrically connected to the second pull-down node, a first electrode of the sixth transistor is electrically connected to the pull-up node, and a second electrode of the sixth transistor is electrically connected to the second voltage line;

The first pull-down node control circuit includes a seventh transistor, an eighth transistor, a ninth transistor, a tenth transistor, and an eleventh transistor;

Both a gate electrode of the seventh transistor and a first electrode of the seventh transistor are electrically connected to the first control voltage line, and a second electrode of the seventh transistor is electrically connected to the first pull-down control node;

A gate electrode of the eighth transistor is electrically connected to the pull-up node, a first electrode of the eighth transistor is electrically connected to the first pull-down control node, and a second electrode of the eighth transistor is electrically connected to the second voltage line connection;

A gate electrode of the ninth transistor is electrically connected to the first pull-down control node, a first electrode of the ninth transistor is electrically connected to the first control voltage line, and a second electrode of the ninth transistor is electrically connected to the first pull-down node;

A gate electrode of the tenth transistor is electrically connected to the pull-up node, a first electrode of the tenth transistor is electrically connected to the first pull-down node, and a second electrode of the tenth transistor is electrically connected to the second voltage line;

A gate electrode of the eleventh transistor is electrically connected to the first input terminal, a first electrode of the eleventh transistor is electrically connected to the first pull-down node, and a second electrode of the eleventh transistor is electrically connected to the second voltage line;

The second pull-down node control circuit includes a twelfth transistor, a thirteenth transistor, a fourteenth transistor, a fifteenth transistor, and a sixteenth transistor;

Both a gate electrode of the twelfth transistor and a first electrode of the twelfth transistor are electrically connected to the second control voltage line, and a second electrode of the twelfth transistor is electrically connected to the second pull-down control node;

A gate electrode of the thirteenth transistor is electrically connected to the pull-up node, a first electrode of the thirteenth transistor is electrically connected to the second pull-down control node, and a second electrode of the thirteenth transistor is electrically connected to the second voltage line;

A gate electrode of the fourteenth transistor is electrically connected to the second pull-down control node, a first electrode of the fourteenth transistor is electrically connected to the second control voltage line, and a second electrode of the fourteenth transistor is electrically connected to the second pull-down node;

A gate electrode of the fifteenth transistor is electrically connected to the pull-up node, a first electrode of the fifteenth transistor is electrically connected to the second pull-down node, and a second electrode of the fifteenth transistor is electrically connected to the second voltage line;

A gate electrode of the sixteenth transistor is electrically connected to the first input terminal, a first electrode of the sixteenth transistor is electrically connected to the second pull-down node, and a second electrode of the sixteenth transistor is electrically connected to the second voltage line;

The reset circuit includes a seventeenth transistor, an eighteenth transistor, a nineteenth transistor and a twentieth transistor;

A gate electrode of the seventeenth transistor is electrically connected to the first pull-down node, a first electrode of the seventeenth transistor is electrically connected to the driving signal output terminal of the current stage, and a second electrode of the seventeenth transistor electrically connected to the first voltage line;

A gate electrode of the eighteenth transistor is electrically connected to the first pull-down node, a first electrode of the eighteenth transistor is electrically connected to the carry signal output terminal of the current stage, and a second electrode of the eighteenth transistor electrically connected to the second voltage line;

A gate electrode of the nineteenth transistor is electrically connected to the second pull-down node, a first electrode of the nineteenth transistor is electrically connected to the driving signal output terminal of the current stage, and a second electrode of the nineteenth transistor is electrically connected to the first voltage line;

A gate electrode of the twentieth transistor is electrically connected to the second pull-down node, a first electrode of the twentieth transistor is electrically connected to the carry signal output terminal of the current stage, and a second electrode of the twentieth transistor is electrically connected to the second voltage line.

In at least one embodiment of the present disclosure, the first voltage line may be a first low voltage line, and the second voltage line may be a second low voltage line, but not limited thereto.

In at least one embodiment of the present disclosure, the orthographic projection of the connection line on the base substrate partially overlaps the orthographic projection of the gate electrode of the fourth transistor on the base substrate;

The orthographic projection of the connection line on the base substrate partially overlaps the orthographic projection of the gate electrode of the thirteenth transistor on the base substrate;

The orthographic projection of the connection line on the base substrate partially overlaps the orthographic projection of the gate electrode of the fifteenth transistor on the base substrate;

The orthographic projection of the connection line on the base substrate partially overlaps the orthographic projection of the gate electrode of the sixteenth transistor on the base substrate;

The orthographic projection of the connection line on the base substrate partially overlaps the orthographic projection of the gate electrode of the twentieth transistor on the base substrate;

The orthographic projection of the connection line on the base substrate partially overlaps the orthographic projection of the gate electrode of the nineteenth transistor on the base substrate;

The orthographic projection of the connection line on the base substrate partially overlaps the orthographic projection of the gate electrode of the sixteenth transistor on the base substrate.

Optionally, the driving circuit further includes a second driving circuit portion;

The second driving circuit portion includes a twenty-first transistor and a twenty-second transistor;

A gate electrode of the twenty-first transistor is electrically connected to the pull-up node, a first electrode of the twenty-first transistor is electrically connected to the output clock signal terminal, and a second electrode of the twenty-first transistor is connected to the driving signal output terminal of the current stage;

A gate electrode of the twenty-second transistor is electrically connected to the pull-up node, a first electrode of the twenty-second transistor is electrically connected to the output clock signal terminal, and a second electrode of the twenty-second transistor is electrically connected to the carry signal output terminal of the current stage.

Figure 22:
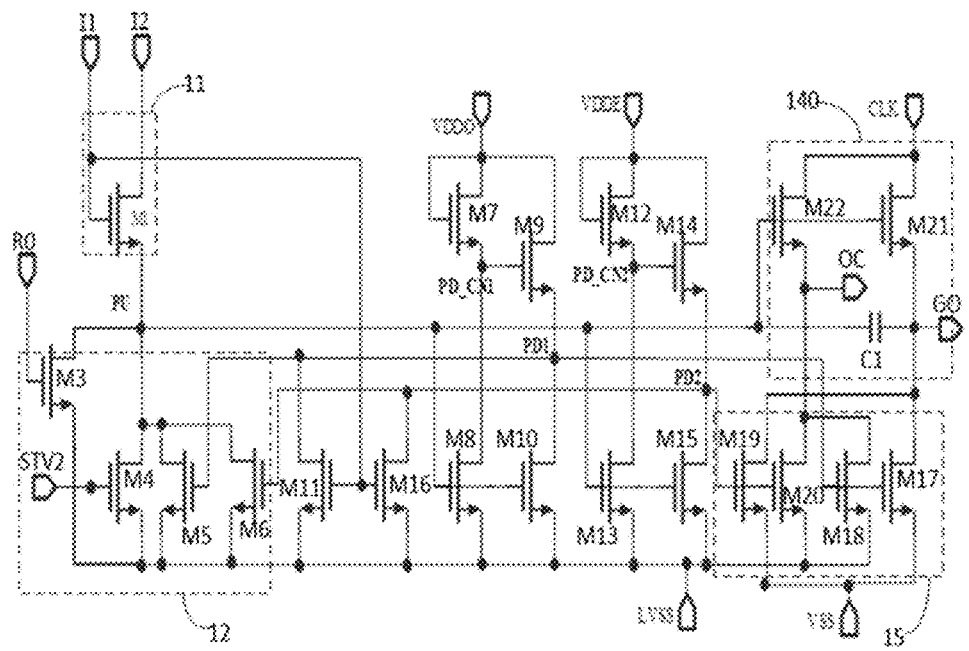
FIG. 22 shows the driving circuit according to at least one embodiment.

As shown in FIG. 22, at least one embodiment of the driving circuit may include a first driving circuit portion and a second driving circuit portion; at least one embodiment of the first driving circuit portion may include an input circuit 11, a pull-up node control circuit 12, a first pull-down node control circuit 13, a second pull-down node control circuit 14 and a reset circuit 15;

The input circuit 11 includes a first transistor M1;

The gate electrode of the first transistor M1 is electrically connected to the first input terminal I1, the first electrode of the first transistor M1 is electrically connected to the second input terminal I2, and the second electrode of the first transistor M1 is connected to the pull-up node PU;

The pull-up node control circuit 12 includes a third transistor M3, a fourth transistor M4, a fifth transistor M5 and a sixth transistor M6;

The gate electrode of the third transistor M3 is electrically connected to the reset terminal R0, the first electrode of the third transistor M3 is electrically connected to the pull-up node PU, the second electrode of the third transistor M3 is electrically connected to the second low voltage line LVSS;

The gate electrode of the fourth transistor M4 is electrically connected to the start signal line STV2, the first electrode of the fourth transistor is electrically connected to the pull-up node PU, and the second electrode of the fourth transistor M4 is electrically connected to the second low voltage line LVSS;

The gate electrode of the fifth transistor M5 is electrically connected to the first pull-down node PD1, the first electrode of the fifth transistor M5 is electrically connected to the pull-up node PU, and the second electrode of the fifth transistor M5 is electrically connected to the second low voltage line LVSS;

The gate electrode of the sixth transistor M6 is electrically connected to the second pull-down node PD2, the first electrode of the sixth transistor M6 is electrically connected to the pull-up node PU, and the second electrode of the sixth transistor M6 is electrically connected to the second low-voltage line LVSS;

The first pull-down node control circuit includes a seventh transistor M7, an eighth transistor M8, a ninth transistor M9, a tenth transistor M10 and an eleventh transistor M11;

Both the gate electrode of the seventh transistor M7 and the first electrode of the seventh transistor M7 are electrically connected to the first control voltage line VDDO, and the second electrode of the seventh transistor M7 is electrically connected to the first pull-down control node PD_CN1;

The gate electrode of the eighth transistor M8 is electrically connected to the pull-up node PU, the first electrode of the eighth transistor M8 is electrically connected to the first pull-down control node PD_CN1, and the second electrode of the eighth transistor M8 is electrically connected to the second low voltage line LVSS;

The gate electrode of the ninth transistor M9 is electrically connected to the first pull-down control node PD_CN1, the first electrode of the ninth transistor M9 is electrically connected to the first control voltage line VDDO, and the second electrode of the ninth transistor M9 is electrically connected to the first pull-down node PD1;

The gate electrode of the tenth transistor M10 is electrically connected to the pull-up node PU, the first electrode of the tenth transistor M10 is electrically connected to the first pull-down node PD1, and the second electrode of the tenth transistor M10 is electrically connected to the second low voltage line LVSS;

The gate electrode of the eleventh transistor M11 is electrically connected to the first input terminal I1, the first electrode of the eleventh transistor M11 is electrically connected to the first pull-down node PD1, and the second electrode of the eleventh transistor M11 is electrically connected to the second low voltage line LVSS;

The second pull-down node control circuit includes a twelfth transistor M12, a thirteenth transistor M13, a fourteenth transistor M14, a fifteenth transistor M15, and a sixteenth transistor M16;

Both the gate electrode of the twelfth transistor M12 and the first electrode of the twelfth transistor M12 are electrically connected to the second control voltage line VDDE, and the second electrode of the twelfth transistor M12 is connected to the second pull-down control node PD_CN2;

The gate electrode of the thirteenth transistor M13 is electrically connected to the pull-up node PU, the first electrode of the thirteenth transistor M13 is electrically connected to the second pull-down control node PD_CN2, and the second electrode of the thirteenth transistor M13 is electrically connected to the second low voltage line LVSS;

The gate electrode of the fourteenth transistor M14 is electrically connected to the second pull-down control node PD_CN2, the first electrode of the fourteenth transistor M14 is electrically connected to the second control voltage line VDDE, and the second electrode of the fourteenth transistor M14 is electrically connected to the second pull-down node PD2;

The gate electrode of the fifteenth transistor M15 is electrically connected to the pull-up node PU, the first electrode of the fifteenth transistor M15 is electrically connected to the second pull-down node PD2, and the second electrode of the fifteenth transistor M15 is electrically connected to the second low voltage line LVSS;

The gate electrode of the sixteenth transistor M16 is electrically connected to the first input terminal I1, the first electrode of the sixteenth transistor M16 is electrically connected to the second pull-down node PD2, and the second electrode of the sixteenth transistor M16 electrically connected to the second low voltage line LVSS;

The reset circuit 15 includes a seventeenth transistor M17, an eighteenth transistor M18, a nineteenth transistor M19 and a twentieth transistor M20;

The gate electrode of the seventeenth transistor M17 is electrically connected to the first pull-down node PD1, the first electrode of the seventeenth transistor M17 is electrically connected to the driving signal output terminal GO of the current stage, and the second electrode of the seventeenth transistor M17 is electrically connected to the first low voltage line;

The gate electrode of the eighteenth transistor M18 is electrically connected to the first pull-down node PD1, the first electrode of the eighteenth transistor M18 is electrically connected to the carry signal output terminal OC of the current stage, and the second electrode of the eighteenth transistor M18 is electrically connected to the second low voltage line LVSS;

The gate electrode of the nineteenth transistor M19 is electrically connected to the second pull-down node PD2, the first electrode of the nineteenth transistor M19 is electrically connected to the driving signal output terminal GO of the current stage, and the second electrode of the nineteenth transistor M19 is electrically connected to the first low voltage line VSS;

The gate electrode of the twentieth transistor M20 is electrically connected to the second pull-down node PD2, the first electrode of the twentieth transistor M20 is electrically connected to the carry signal output terminal OC of the current stage, and the second electrode of the twentieth transistor M20 is electrically connected to the second low voltage line LVSS;

The second driving circuit portion 140 includes a twenty-first transistor M21, a twenty-second transistor M22 and a first capacitor C1;

The gate electrode of the twenty-first transistor M21 is electrically connected to the pull-up node PU, the first electrode of the twenty-first transistor M21 is electrically connected to the output clock signal terminal CLK, and the second electrode of the twenty-first transistor M21 is electrically connected to the driving signal output terminal GO of the current stage;

The gate electrode of the twenty-second transistor M22 is electrically connected to the pull-up node PU, the first electrode of the twenty-second transistor M22 is electrically connected to the output clock signal terminal CLK, and the second electrode of the twenty-second transistor M22 is electrically connected to the carry signal output terminal GO of the current stage;

The first electrode plate of the first capacitor C1 is electrically connected to the pull-up node PU, and the second electrode plate of the first capacitor C1 is electrically connected to the driving signal output terminal GO of the current stage.

In at least one embodiment of the driving circuit shown in FIG. 22, the first input terminal I1 is electrically connected to the carry signal output terminal of the adjacent previous stage, and the second input terminal I2 is electrically connected to the driving signal output terminal of the adjacent previous stage, but not limited to this.

In at least one embodiment of the driving circuit shown in FIG. 22, the eleventh transistor M11 and the sixteenth transistor M16 for total reset may not be provided.

In at least one embodiment of the driving circuit shown in FIG. 22, only one pull-down node may be used, that is, the second pull-down node control circuit may not be provided; and when only the first pull-down node PU1 is set, M6, M16, M19 and M20 whose gate electrodes are electrically connected to the second pull-down node PD2 are not provided.

In specific implementation, the second driving circuit portion may further include a second transistor;

The gate electrode of the second transistor is electrically connected to the reset control terminal, the first electrode of the second transistor is electrically connected to the driving signal output terminal of the current stage, and the second electrode of the second transistor is electrically connected to the first voltage line.

Figure 23:
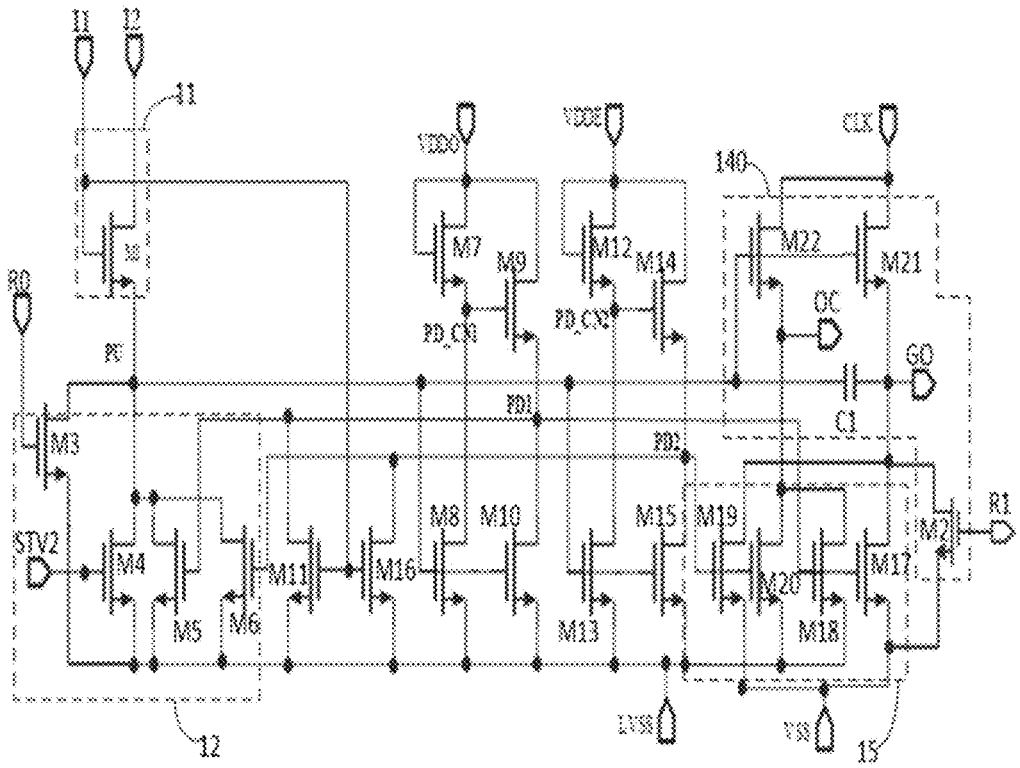
FIG. 23 shows the driving circuit according to at least one embodiment.

As shown in FIG. 23, in at least one embodiment of the driving circuit shown in FIG. 22, the second driving circuit portion may further include a second transistor M2;

The gate electrode of M2 is electrically connected to the reset control terminal R1, the first electrode of M2 is electrically connected to the driving signal output terminal GO of the current stage, and the second electrode of M2 is electrically connected to the first low voltage line VSS, for example, the reset control terminal R1 of the Nth stage of driving circuit is electrically connected to the driving signal output terminal GO of the current stage of the (N+J)th stage of driving circuit, wherein N and J are positive integers greater than or equal to 1, and M2 is used to reset the driving signal output terminal GO of the current stage. Optionally, the reset control R1 of the Nth stage of driving circuit may also be electrically connected to the carry signal output terminal OC of the current stage of the (N+J)th stage of driving circuit, which is not limited here.

In at least one embodiment of the present disclosure, a groove is provided between the first electrode of the twenty-first transistor and the second electrode of the twenty-first transistor;

Both the first electrode of the twenty-first transistor and the second electrode of the twenty-first transistor are formed on the first metal layer.

Figure 24:
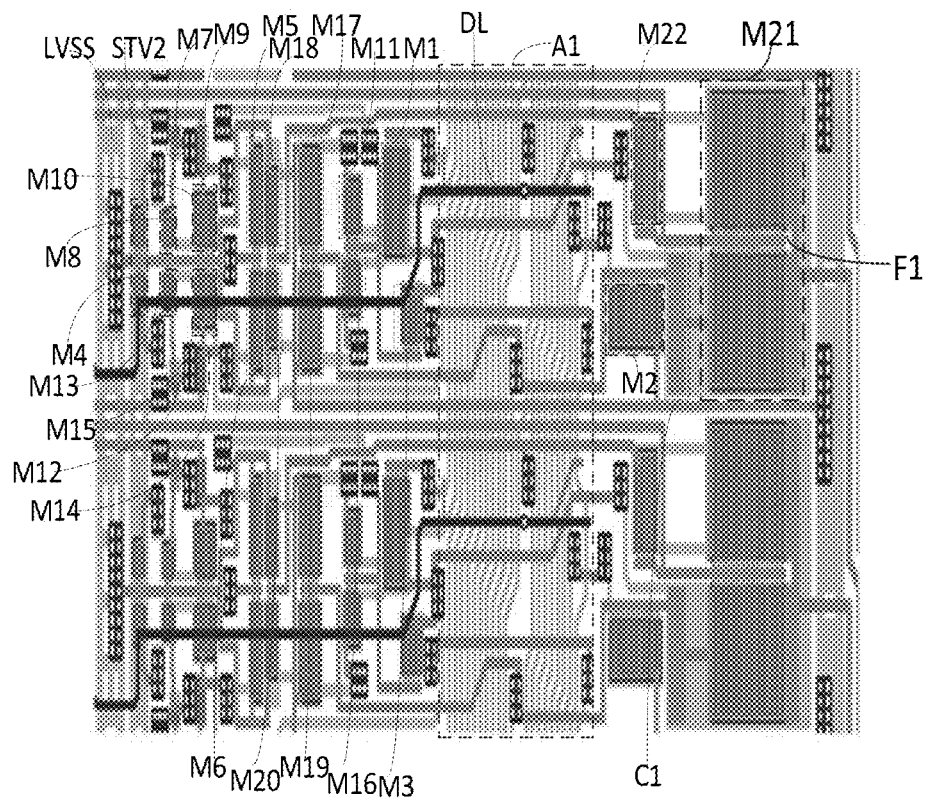
FIG. 24 is a layout diagram of the first driving circuit portion, the line collection portion and the second driving circuit portion of the driving module included in the display substrate according to at least one embodiment of the present disclosure.

As shown in FIG. 20 and FIG. 24, a groove F1 may be provided between the first electrode of the twenty-first transistor M21 and the second electrode of the twenty-first transistor M21, so that the first electrode of M21 and the second electrode of M21 are not connected;

Both the first electrode of M21 and the second electrode of M21 may be formed in the source-drain metal layer.

In FIG. 20, the one labeled S21 is the first electrode of M21, the one labeled S22 is the second electrode of M21, the one labeled S22 is the first electrode of M22, and the one labeled D22 is the second electrode of M22.

In FIG. 24, the one labeled A1 is the line collection area. In FIG. 24, each transistor and the first capacitor C1 are shown, the one labeled STV2 is the second start signal line, the one labeled LVSS is the second low voltage line, and the one labeled DL is the connection line.

As shown in FIG. 24, the orthographic projection of the connection line DL on the base substrate partially overlaps the orthographic projection of the gate electrode of the fourth transistor M4 on the base substrate;

The orthographic projection of the connection line DL on the base substrate partially overlaps the orthographic projection of the gate electrode of the thirteenth transistor M13 on the base substrate;

The orthographic projection of the connection line DL on the base substrate partially overlaps the orthographic projection of the gate electrode of the fifteenth transistor M15 on the base substrate;

The orthographic projection of the connection line DL on the base substrate partially overlaps the orthographic projection of the gate electrode of the sixteenth transistor M16 on the base substrate;

The orthographic projection of the connection line DL on the base substrate partially overlaps the orthographic projection of the gate electrode of the twentieth transistor M20 on the base substrate;

The orthographic projection of the connection line DL on the base substrate partly overlaps the orthographic projection of the gate electrode of the nineteenth transistor M19 on the base substrate;

The orthographic projection of the connection line DL on the base substrate partially overlaps the orthographic projection of the gate electrode of the sixteenth transistor M16 on the base substrate.

Figure 25:
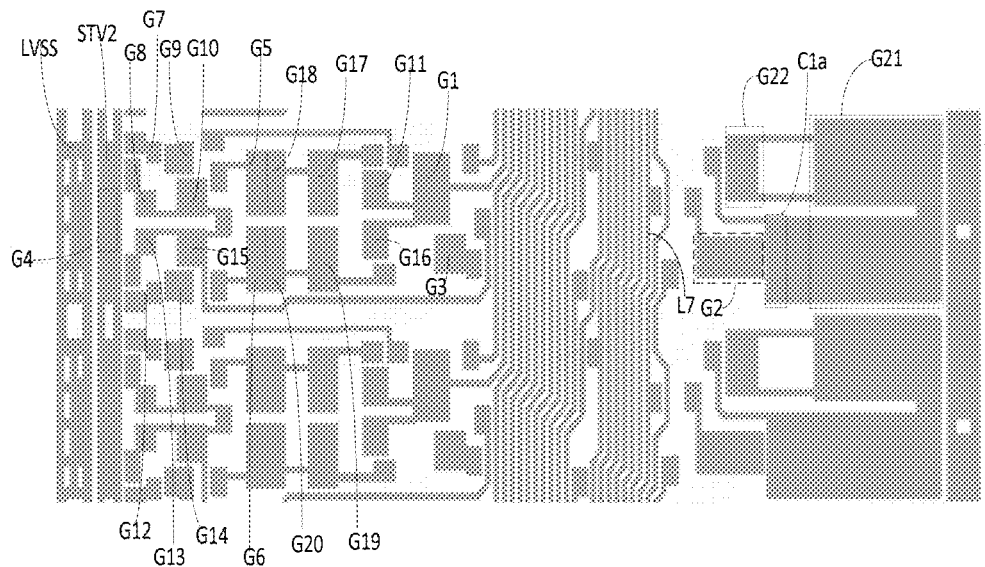
FIG. 25 is a layout diagram of the gate metal layer in FIG. 24.

FIG. 25 is a layout diagram of the gate metal layer shown in FIG. 19, in which the reference numerals of the gate electrodes of transistors are added.

In FIG. 25, the one labeled G1 is the gate electrode of M1, the one labeled G2 is the gate electrode of M2, the one labeled G3 is the gate electrode of M3, and the one labeled G4 is the gate electrode of M4; G4 and the start signal line STV2 are integrally formed;

The one labeled G5 is the gate electrode of M5, the one labeled G6 is the gate electrode of M6, the one labeled G7 is the gate electrode of M7, the one labeled G8 is the gate electrode of M8; the one labeled G9 is the gate electrode of M9, and the one labeled G10 is the gate electrode of M10, the one labeled G11 is the gate electrode of M11, the one labeled G12 is the gate electrode of M12; the one labeled G13 is the gate electrode of M13, the one labeled G14 is the gate electrode of M14, and the one labeled G15 is the gate electrode of M15, the one labeled G16 is the gate electrode of M16; the one labeled G17 is the gate electrode of M17, the one labeled G18 is the gate electrode of M18, the one labeled G19 is the gate electrode of M19, and one labeled G20 is the gate electrode of M20, the one labeled G21 is the gate electrode of M21, the one labeled G22 is the gate electrode of M22, and the one labeled C1*a* is the first electrode plate of C1.

In FIG. 20, the one labeled C1*b* is the second electrode plate of C1.

Figure 26:
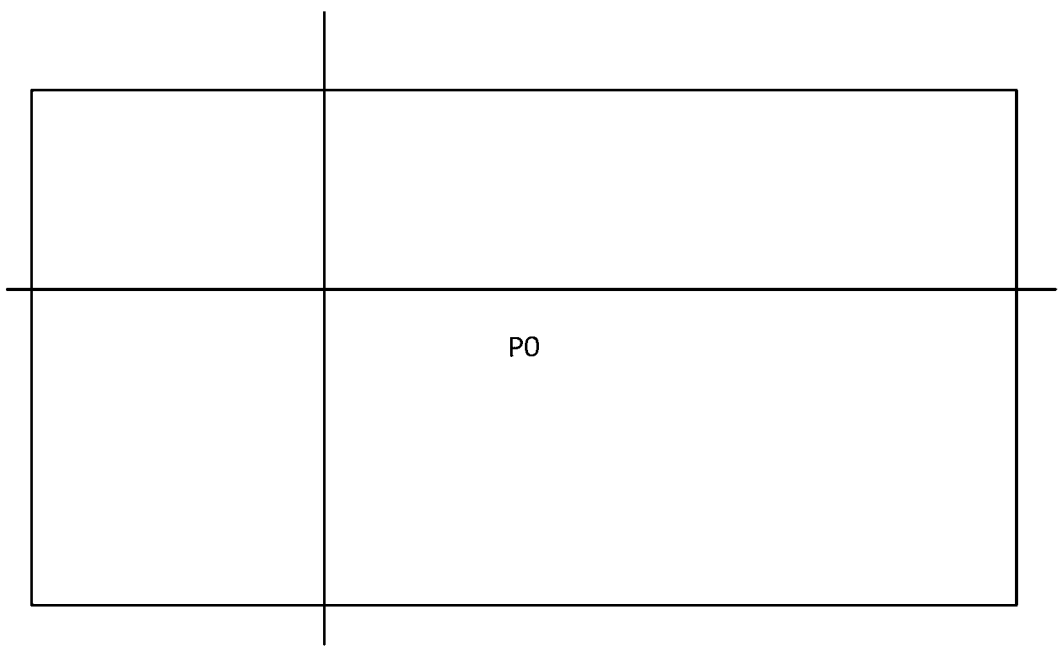
FIG. 26 is a structural diagram of a display substrate according to at least one embodiment of the present disclosure.

As shown in FIG. 26, by using the display substrate described in at least one embodiment of the present disclosure, the display substrate P0 not only can be cut vertically, the display substrate P0 but also can be cut horizontally.

Figure 27:
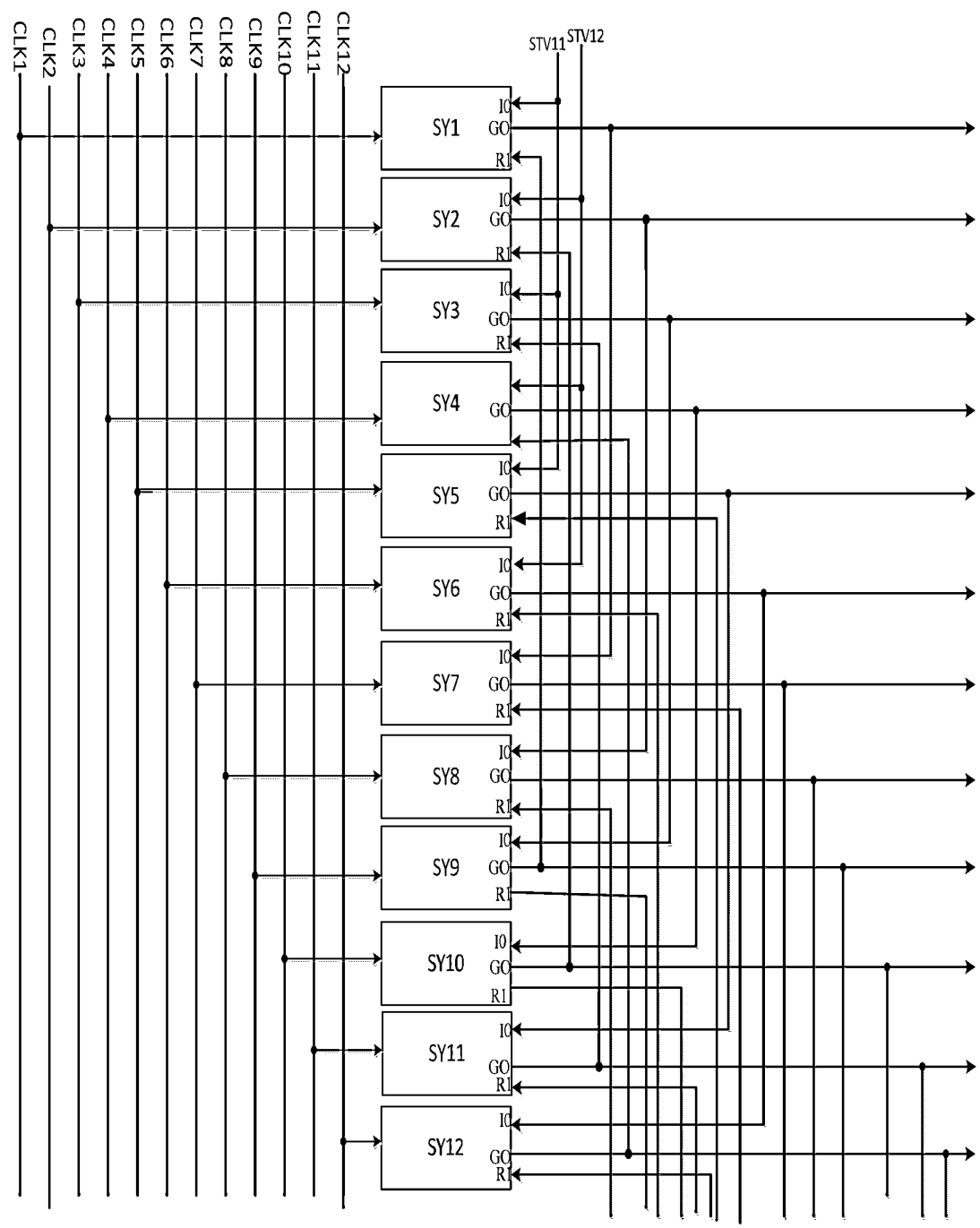
FIG. 27 is a structural diagram of the driving module according to at least one embodiment.

FIG. 27 is a cascade diagram of the driving module.

In FIG. 27, the one labeled SY1 is the first stage of driving circuit, the one labeled SY2 is the second stage of driving circuit, the one labeled SY3 is the third stage of driving circuit, the one labeled SY4 is the fourth stage of driving circuit, the one labeled SY5 is the fifth stage of driving circuit, the one labeled SY6 is the sixth stage of driving circuit, the one labeled SY7 is the seventh stage of driving circuit, the one labeled SY8 is the eighth stage of driving circuit, the one labeled SY9 is the ninth stage of driving circuit, the one labeled SY10 is the tenth stage of driving circuit, the one labeled SY11 is the eleventh stage of driving circuit, the one labeled SY12 is the twelfth stage of driving circuit;

The one labeled CLK1 is the first clock signal line, the one labeled CLK2 is the second clock signal line, the one labeled CLK3 is the third clock signal line, the one labeled CLK4 is the fourth clock signal line, and the one labeled CLK5 is the fifth clock signal line, the one labeled CLK6 is the sixth clock signal line, the one labeled CLK7 is the seventh clock signal line, the one labeled CLK8 is the eighth clock signal line, the one labeled CLK9 is the ninth clock signal line, the one labeled CLK 10 is the tenth clock signal line, the one labeled CLK11 is the eleventh clock signal line, and the one labeled CLK12 is the twelfth clock signal line;

The one labeled STV11 is the first initial voltage line, and the one labeled STV12 is the second initial voltage line;

The one labeled I0 is the input terminal, the one labeled R1 is the reset control terminal, and the one labeled GO is the output terminal of the driving signal.

As shown in FIG. 27, STV11 is electrically connected to the input terminals of SY1, SY3 and SY5, and STV12 is electrically connected to the input terminals of SY2, SY4 and SY6.

Figure 28:
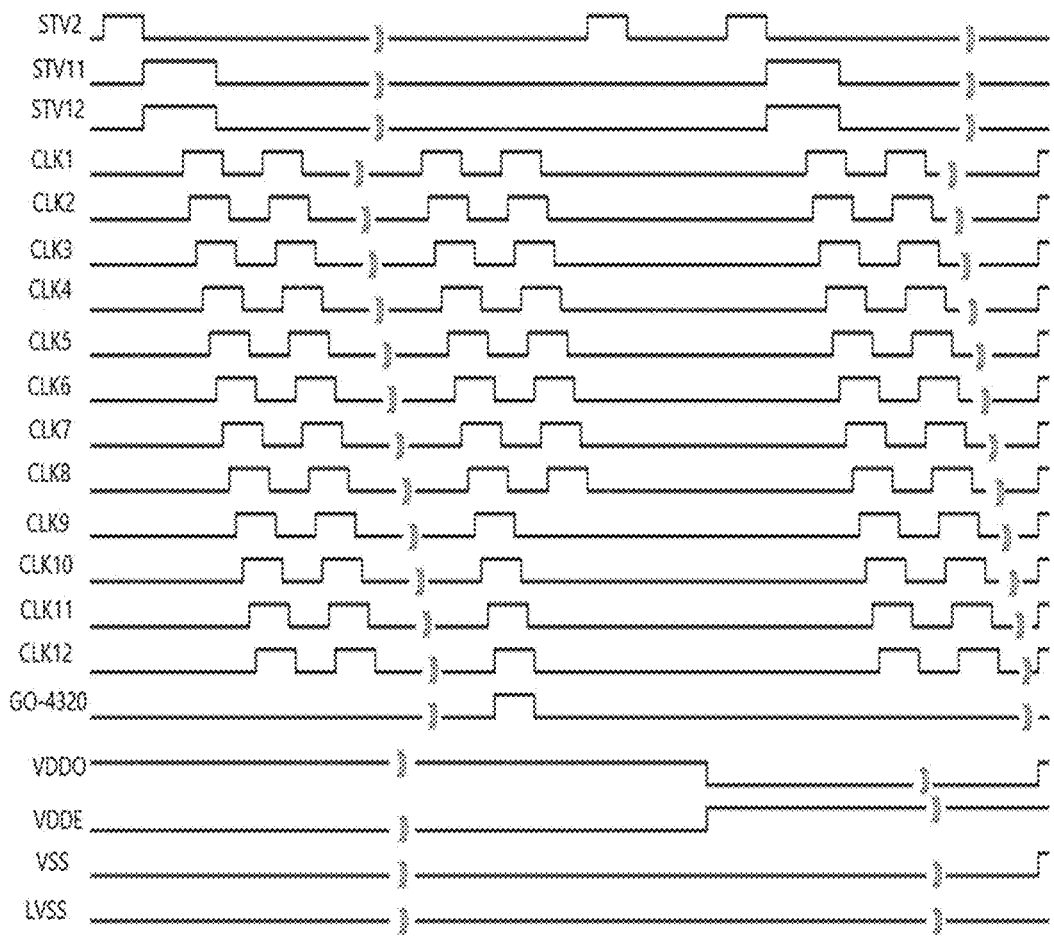
FIG. 28 is a working timing diagram of the driving circuit shown in FIG. 27.

FIG. 28 is a working timing diagram of the driving module shown in FIG. 27. In FIG. 28, the one labeled GO-4320 is the driving signal of the 4320th row.

Figure 29:
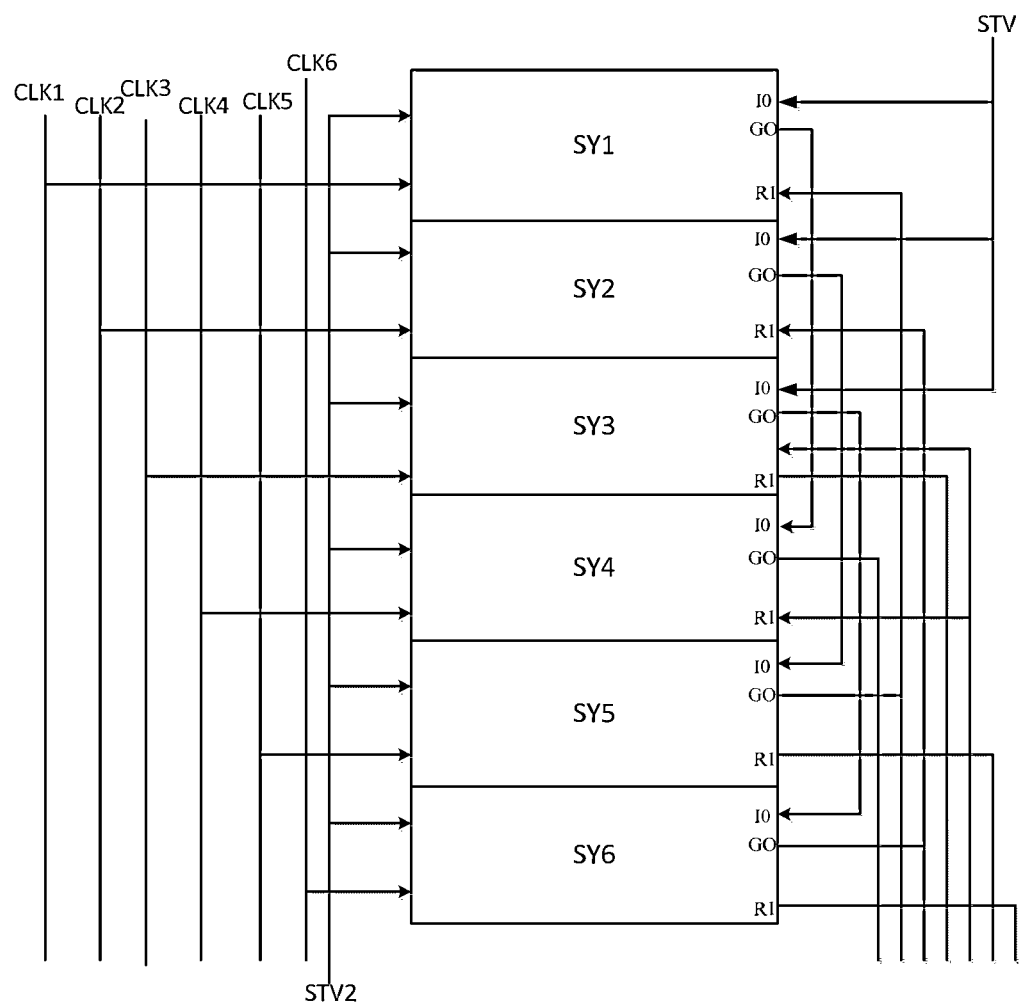
FIG. 29 is a structural diagram of the driving module according to at least one embodiment.

In FIG. 29, the one labeled SY1 is the first stage of driving circuit, the one labeled SY2 is the second stage of driving circuit, the one labeled SY3 is the third stage of driving circuit, and the one labeled SY4 is the fourth stage of driving circuit. the one labeled SY5 is the fifth stage of driving circuit, and the one labeled SY6 is the sixth stage of driving circuit;

The one labeled CLK1 is the first clock signal line, the one labeled CLK2 is the second clock signal line, the one labeled CLK3 is the third clock signal line, the one labeled CLK4 is the fourth clock signal line, and the one labeled CLK5 is the fifth clock signal line, the one labeled CLK6 is the sixth clock signal line;

The one labeled I0 is the input terminal, the one labeled R1 is the reset control terminal, the one labeled GO is the driving signal output terminal, the one labeled STV is the initial voltage line, and the one labeled STV2 is the initial signal line.

Figure 30:
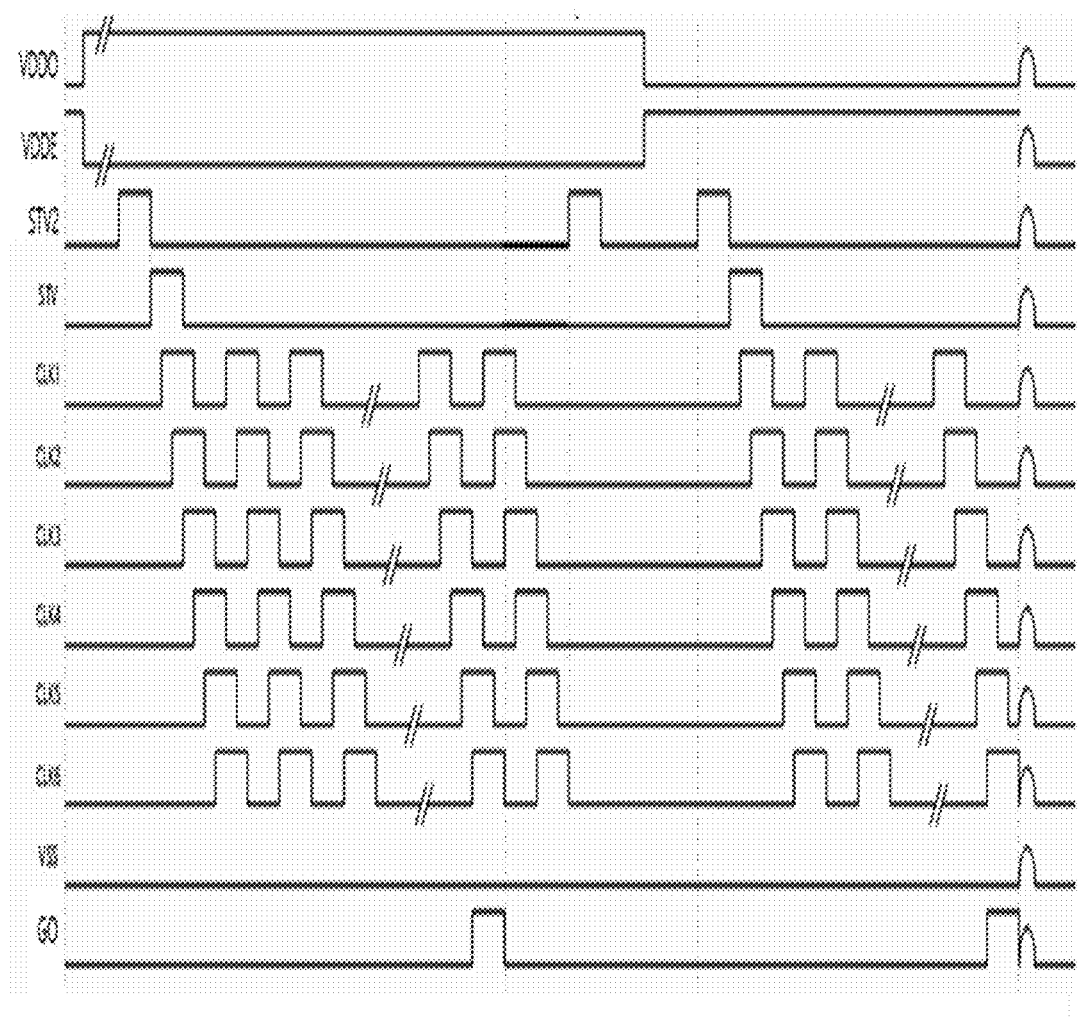
FIG. 30 is a working timing diagram of the driving module shown in FIG. 29.

FIG. 30 is a working timing diagram of the driving module shown in FIG. 29.

Figure 31:
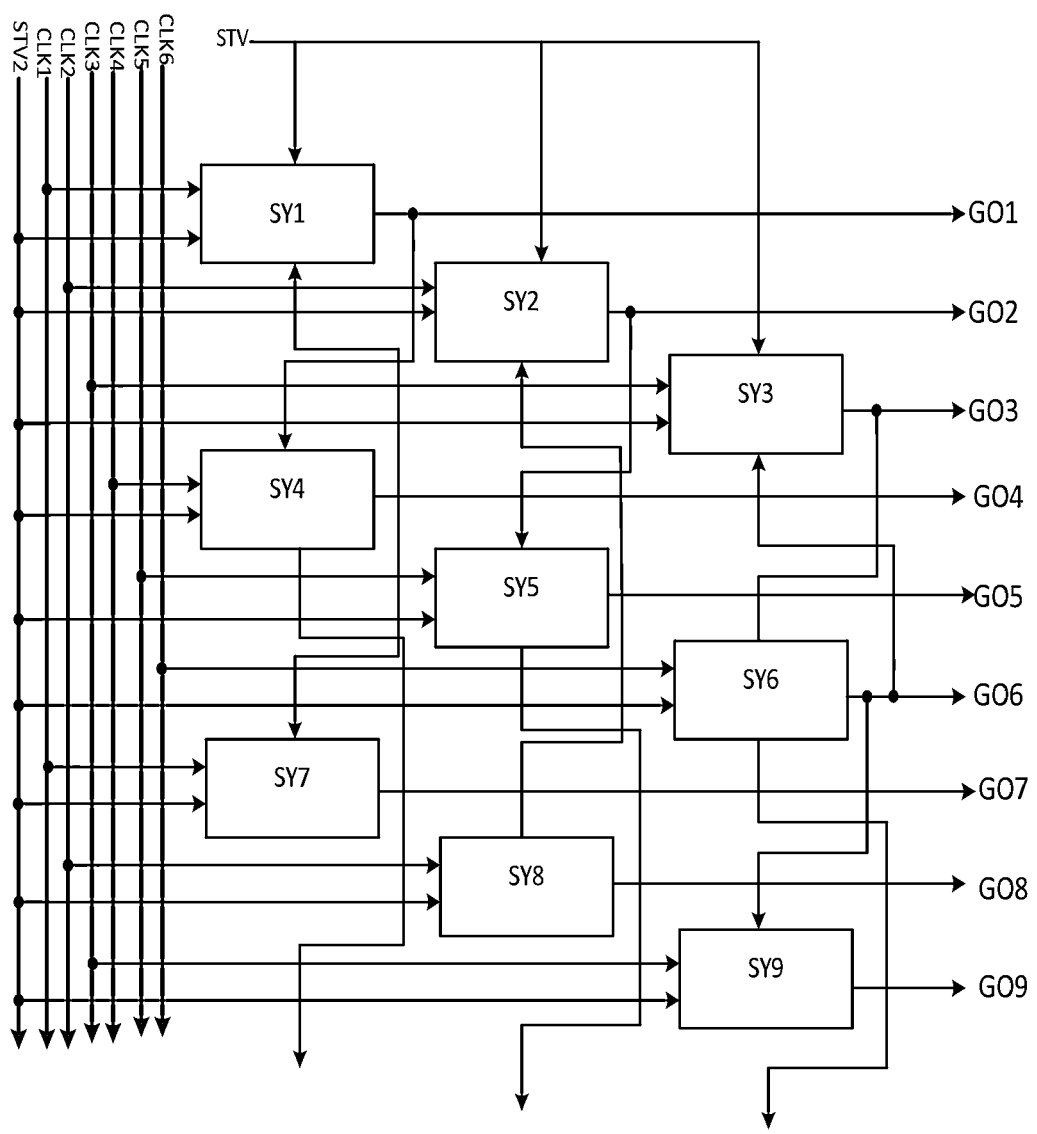
FIG. 31 is a structural diagram of the driving module according to at least one embodiment.

In FIG. 31, the one labeled SY1 is the first stage of driving circuit, the one labeled SY2 is the second stage of driving circuit, the one labeled SY3 is the third stage of driving circuit, the one labeled SY4 is the fourth stage of driving circuit, the one labeled SY5 is the fifth stage of driving circuit, the one labeled SY6 is the sixth stage of driving circuit, the one labeled SY7 is the seventh stage of driving circuit, the one labeled SY8 is the eighth stage of driving circuit, and the one labeled SY9 is the ninth stage of driving circuit;

The one labeled CLK1 is the first clock signal line, the one labeled CLK2 is the second clock signal line, the one labeled CLK3 is the third clock signal line, the one labeled CLK4 is the fourth clock signal line, and the one labeled CLK5 is the fifth clock signal line, the one labeled CLK6 is the sixth clock signal line; the one labeled STV is the initial voltage line, and the one labeled STV2 is the start signal line;

The one labeled GO1 is the first driving signal output terminal, the one labeled GO2 is the second driving signal output terminal, the one labeled GO3 is the third driving signal output terminal, the one labeled GO4 is the fourth driving signal output terminal, and the one labeled GO5 is the fifth driving signal output terminal, the one labeled GO6 is the sixth driving signal output terminal, the one labeled GO7 is the seventh driving signal output terminal, the one labeled GO8 is the eighth driving signal output terminal, and the one labeled GO9 is the ninth driving signal output terminal.

Figure 32:
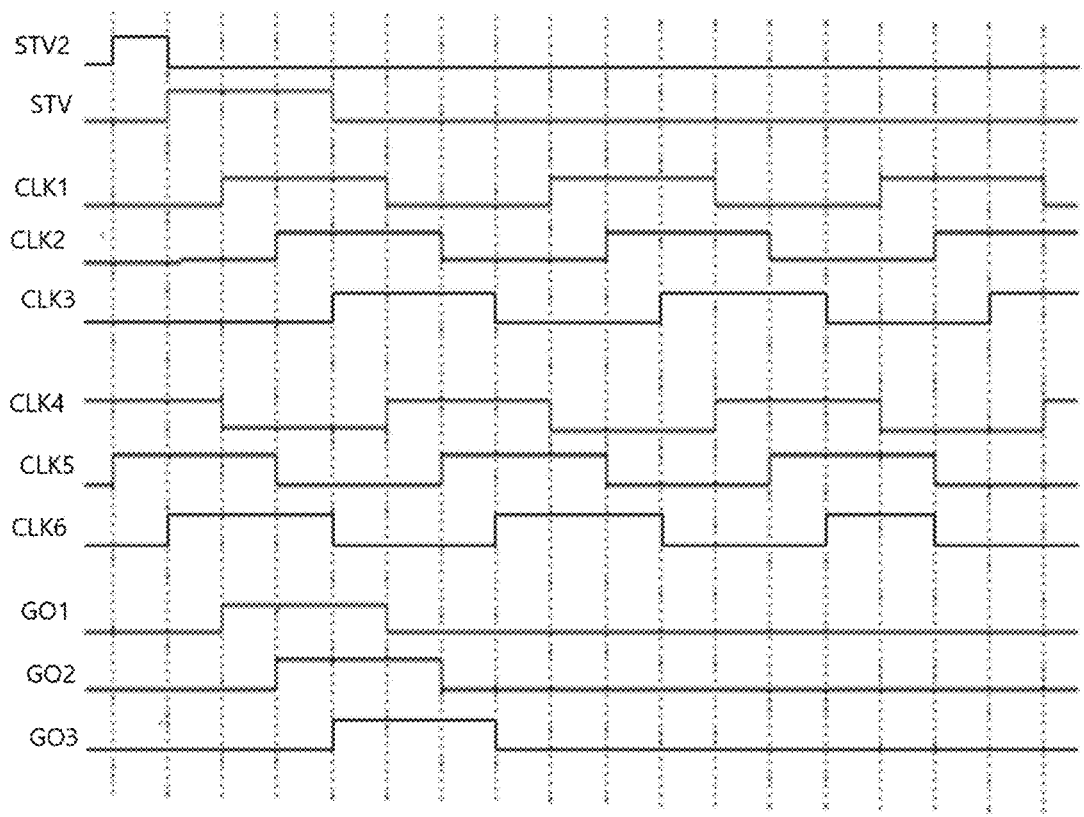
FIG. 32 is a working timing diagram of the driving module shown in FIG. 31.

FIG. 32 is a working timing diagram of the driving module shown in FIG. 11.

The repair method described in the embodiment of the present disclosure is applied to the above-mentioned display substrate, and the repair method includes:

When first c stages of driving circuits included in the driving module in the display substrate is cut off, controlling the connection line to be electrically connected to the initial voltage line, and controlling the connection line to be electrically connected to the input terminal of the first predetermined driving circuit included in the driving module;

The first predetermined driving circuit is a (c+1)th stage of driving circuit to a (c+a)th stage of driving circuit;

Both c and a are positive integers.

In specific implementation, when the first c stages of driving circuits included in the driving module in the display substrate is cut off, the connection line can be controlled to be electrically connected to the initial voltage line by welding or other means, and the connection line can be controlled to be connected to the input terminal of the first predetermined driving circuit included in the driving module.

In a specific implementation, at least part of the connection lines and the initial voltage lines are located on different layers, so that when repair is required, the connection lines can be electrically connected to the initial voltage lines by welding or other means; the connection line and the input cascade lines are located on different layers, so that when repair is required, the connection line can be electrically connected to the input cascade line by welding or other means, so that after the display substrate is cut horizontally, the input terminals of the (c+1)th stage of driving circuit to the (c+a)th stage of driving circuit included in the display module can all be electrically connected to the initial voltage line.

Figure 33:
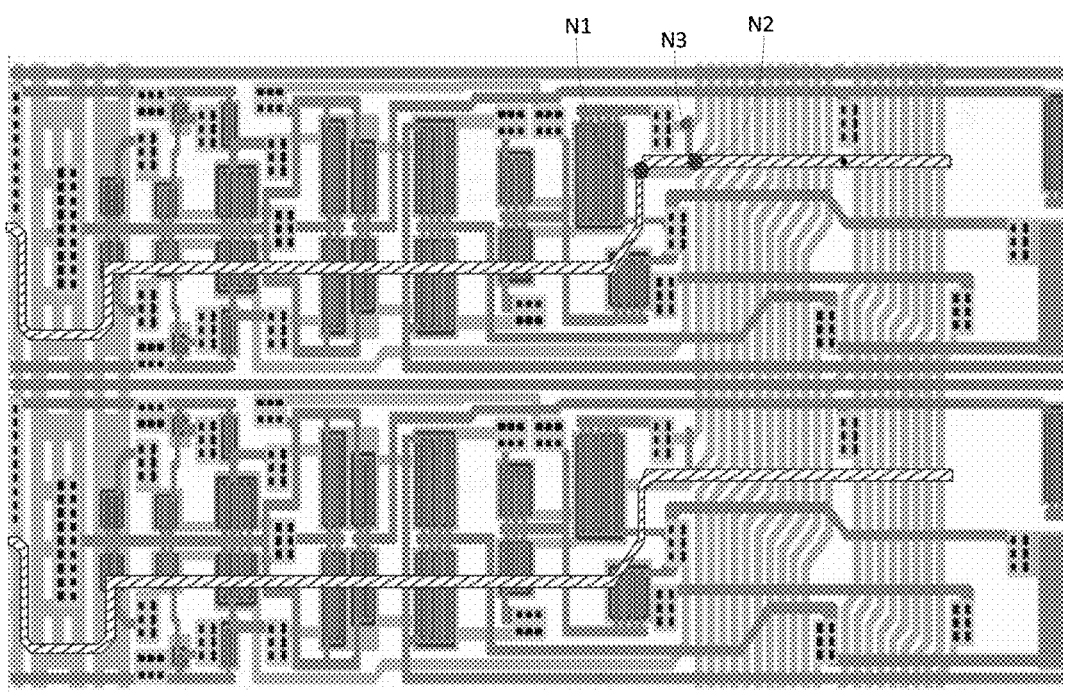
FIG. 33 is a schematic diagram of a welding position after first three stages of driving circuits are cut and removed.

For example, referring to FIG. 3 and FIG. 33, after the first three stages of driving circuits are cut off, the fourth stage of driving circuit SY4 is electrically connected to the fourth connection line DL4 by welding. The specific welding position is shown in FIG. 33, which shows the partial schematic diagram of the fourth stage of driving circuit, referring to FIG. 22, the gate electrode and source electrode of the input transistor M1 are connected to different signal terminals, and the drain electrode of M1 is electrically connected to the pull-up node PU. After cutting off the first three stages of driving circuits, in order to achieve normal display, welding can be realized at the No. 1 position N1 and/or No. 2 position N2, that is, the electrical connection can be realized at the overlapping position of the connection line and the signal line that transmits the gate signal to the gate electrode of M1, and at the same time, the welding can be realized at the No. 3 position N3. That is, the electrical connection is realized at the position where the connection line overlaps with the signal line that transmits the source signal to the source electrode of M1, so that the initial signal can be transmitted to the gate electrode and source electrode of the transistor in the fourth stage of driving circuit, after cutting off the first 3 stages of driving circuits, the display panel can still transmit normal start signals. Optionally, the gate electrode of M1 and the source electrode of M1 are initially connected together to transmit the same signal, then the electrical connection is realized by welding at the position where the connection line overlaps the signal lines for transmitting the gate signal to the gate electrode of M1 or transmitting the source signal to the source electrode of M1. At least one embodiment of the present disclosure is described by cutting off the first three stages of driving circuit as an example, and the specific cutting position can be set according to the actual situation.

It should be noted that in at least one embodiment of the present disclosure, the connection line and the initial voltage line can be electrically connected in advance through the electrode layer, that is, in the initial state, one terminal of the connection line is electrically connected to the initial voltage line, and after subsequent cutting, and then the electrical connection is realized by welding between the connection line and the cascading line; it can also be that in the initial state, one terminal of the connection line is not electrically connected to the initial voltage line, and after subsequent cutting, one terminal of the connection line is connected to the initial voltage line by welding, and the electrical connection is realized by welding between the connection lines and the cascading lines.

In at least one embodiment of the present disclosure, the driving circuit further includes a reset control terminal and at least one clock signal line; the reset control terminal of the nth stage of driving circuit included in the driving module is electrically connected to the output terminal of the (n+b)th stage of driving circuit included in the driving module through a reset cascade line; n and b are positive integers; the repair method includes:

When the reset cascade line is disconnected, controlling the electrical connection between the connection line and the reset cascade line, and controlling the electrical connection between the connection line and the corresponding clock signal line.

Figure 34:
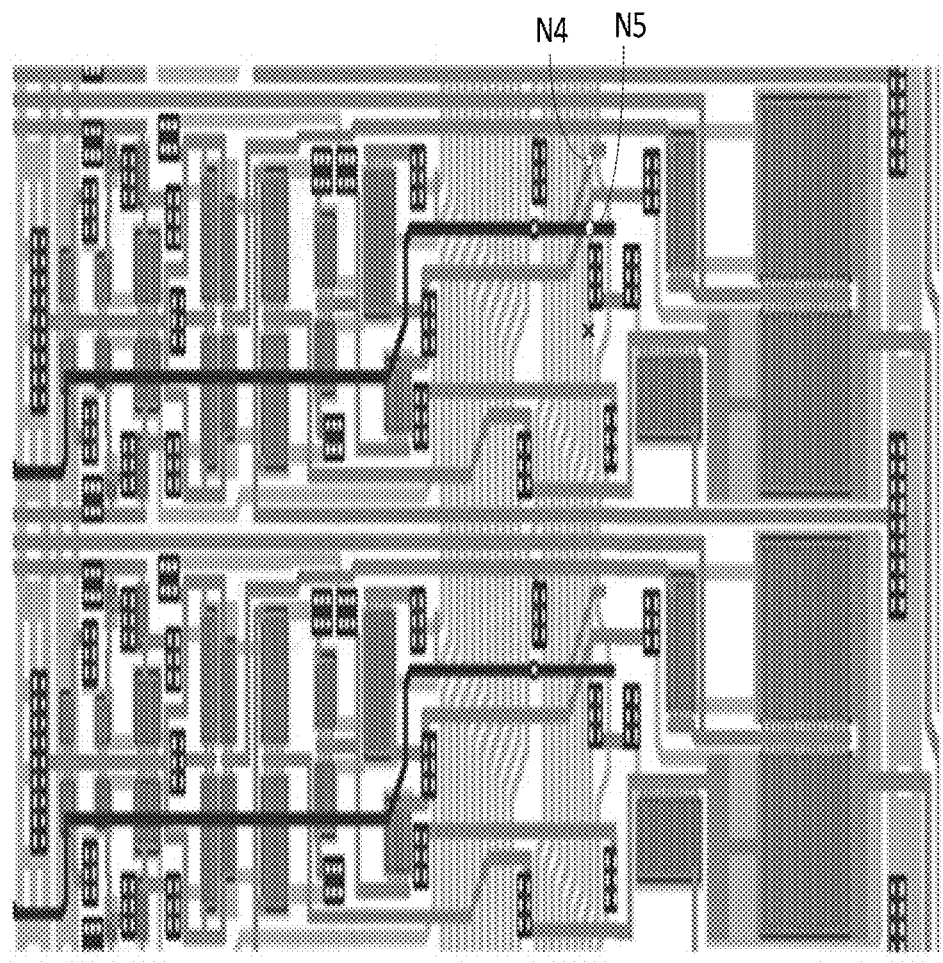
FIG. 34 is a schematic diagram of the welding position when a reset stage of line is disconnected.

Referring to FIG. 34, the connection line DL can also be used to repair the reset cascade line, for example, referring to FIG. 23, the gate signal of M2 can be fed by the driving signal output terminal GO of a certain stage of the driving circuit or the carry signal output terminal of a certain stage of the driving circuit, and the gate signal of M2 is illustrated by the driving signal output terminal GO of a certain stage of driving circuit as an example. For example, the driving signal output terminal GO of the (N+J) stage of driving circuit sends signals through the cascade line (the signal line corresponding to the cross) to the reset control terminal R1 of the Nth stage of driving circuit. Referring to FIG. 34, when the cascade line for sending signals is disconnected, the driving signal output terminal GO of the (N+J) stage of driving circuit cannot transmit the reset control signal to the reset control terminal R1 of the Nth stage of driving circuit, and then the M2 of the Nth stage of driving circuit works abnormally. The electrical connection is realized by welding at No. 4 position N4 and/or No. 5 position N5 in FIG. 34, that is, the position where the connection line DL overlaps with the cascaded signal line that transmits control signals to M2, and the other terminal of the connection line DL can refer to FIG. 1, which is electrically connected to the clock signal line. At this time, the clock signal line that is partially same as the driving signal provided by the driving signal output terminal GO of the (N+J)th stage of driving circuit. The clock signal line is welded to the connection line DL, so that the clock signal directly provides a reset control signal for the gate electrode of M2 of the Nth stage of driving circuit, and avoids the problem of abnormal reset of the N stage of driving circuit due to abnormal cascade signals. For example, the driving signal output terminal GO of the 15th stage of driving circuit provides a reset control signal to the gate electrode of M2 of the 7th stage of driving circuit, at this time if the cascade signal line is disconnected as shown in FIG. 34, and the timing of the clock signal transmitted by the third clock signal line CLK3 is the same as the timing of the signal provided by the driving signal output terminal GO of the 15th stage of driving circuit, the other terminal of the connection line DL is connected to the third clock signal line CLK3 by welding, this description is only for illustration, and the specific repair is set according to actual needs.

In addition, continue to refer to FIG. 34, when the cascaded signal line is short-circuited, such as the crossed position, the first choice is to cut off the short-circuited position and then weld the two terminals of the DL to the clock signal line and the cascaded signal line to achieve electrical connection, the specific welding position is as described in the above disconnection portion, and will not be repeated here.

In specific implementation, when the reset cascade line is disconnected, the electrical connection between the connection line and the reset cascade line can be controlled and the electrical connection between the connection line and the corresponding clock signal line can be controlled by means of welding, so that the reset cascaded lines are electrically connected to corresponding clock signal lines.

In at least one embodiment of the present disclosure, the driving circuit further includes a reset control terminal and at least one clock signal line; the reset control terminal of the nth stage of driving circuit included in the driving module is electrically connected to the output terminal of the (n+b)th stage of driving circuit included in the driving module through a reset cascade line; b is a positive integer; the repair method includes:

When it is detected that the reset cascade line is short-circuited, cutting off a short-circuit point between the reset cascade line and other signal lines;

Controlling the electrical connection between the connection line and the reset cascade line, and controlling the electrical connection between the connection line and the corresponding clock signal line.

In specific implementation, when the reset cascade line is short-circuited, the short-circuit point between the reset cascade line and the other signal lines is first cut off, and then the electrical connection between the connection line and the reset cascade line is controlled by welding or other means, and the electrical connection between the connection lines and the corresponding clock signal lines is controlled, so that the electrical connection between the reset cascaded lines and the corresponding clock signal lines is controlled.

The repair method described in at least one embodiment of the present disclosure includes:

selecting the corresponding clock signal line according to the timing of the reset control signal that the reset control terminal needs to access, so that when the driving signal provided by the driving signal terminal included in the nth stage of driving circuit needs to be reset, providing, by the corresponding clock signal line, a valid clock signal.

In at least one embodiment of the present disclosure, when selecting the corresponding clock signal line, according to the timing of the reset control signal that the reset control terminal needs to access, when the driving signal provided by the driving signal terminal included in the nth stage of driving circuit needs to be reset, the corresponding clock signal line provides a valid clock signal to the reset control terminal, so that the corresponding second transistor is turned on.

The display device described in the embodiment of the present disclosure includes the above-mentioned display substrate.

The display device provided by the embodiments of the present disclosure may be any product or component with a display function, such as a mobile phone, a tablet computer, a television, a monitor, a notebook computer, a digital photo frame, a navigator, and the like.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate and a driving module arranged on the base substrate; wherein the driving module includes N driving circuits connected in series;

the driving circuit includes an input terminal; N is a positive integer;

input terminals of first a stages of driving circuits included in the driving module are electrically connected to an initial voltage line; a is a positive integer;

an input terminal of an nth stage of driving circuit included in the driving module is electrically connected to an output terminal of an (n–m)th stage of driving circuit included in the driving module through an input cascade line; n and m are positive integers, and m is less than n;

the driving module further includes at least one connection line, and the connection line extends along a first direction;

there is an overlapping portion between an orthographic projection of the connection line on the base substrate and an orthographic projection of the initial voltage line on the base substrate;

there is an overlapping portion between the orthographic projection of the connection line on the base substrate and an orthographic projection of the input cascade line on the base substrate, wherein the driving module includes a plurality of clock signal lines, a plurality of stages of driving circuits and a line collection portion; the driving circuit includes a first driving circuit portion and a second driving circuit portion;

the plurality of clock signal lines, the first driving circuit portion, the line collection portion and the second driving circuit portion are arranged in sequence along a direction close to a display area; the input cascade line is arranged in the line collection portion; the driving circuit includes the first driving circuit portion and the second driving circuit portion, and wherein the second driving circuit portion includes an output transistor in the driving circuit; the first driving circuit portion includes a pull-up node control sub-circuit, a pull-down node control sub-circuit and an output reset sub-circuit; the pull-up node control sub-circuit is configured to control a potential of the pull-up node, and the pull-down node control sub-circuit is configured to control a potential of the pull-down node, and the output reset sub-circuit is used to reset a driving signal under the control of the potential of the pull-down node.

2. The display substrate according to claim 1, wherein at least part of the connection line is located on different layers from the initial voltage line, and at least part of the connection line is located on different layers from the input cascade line.

3. The display substrate according to claim 1, wherein the connection line is arranged between two adjacent driving circuits; or, the connection line penetrates through at least part of the driving circuit.

4. The display substrate according to claim 1, wherein, the connection line included in the driving module penetrates through the clock signal line, the first driving circuit portion and the line collection portion included in the driving circuit along a direction from away from the display area to close to the display area.

5. The display substrate according to claim 1, wherein the display panel includes a first metal layer and an electrode layer arranged in sequence in a direction away from the base substrate; the connection line includes a first line portion formed on the electrode layer and a second line portion formed on the first metal layer; the first line portion is electrically connected to the second line portion; at least part of the first line portion is arranged in a clock signal line area, the first driving circuit portion and the line collection portion; the clock signal line area is an area where the plurality of clock signal lines are arranged; at least part of the second line portion is arranged on the line collection portion.

6. The display substrate according to claim 1, wherein the driving circuit includes an input circuit; a control terminal of the input circuit and/or a first terminal of the input circuit are electrically connected to an input terminal, and a second terminal of the input circuit is electrically connected to the pull-up node;

the input circuit is configured to control the potential of the pull-up node under the control of an input signal provided by the input terminal.

7. The display substrate according to claim 6, wherein the input circuit includes a first transistor;

a gate electrode of the first transistor is electrically connected to a first input terminal, a first electrode of the first transistor is electrically connected to a second input terminal, and a second electrode of the first transistor is electrically connected to the pull-up node;

the first input terminal and the second input terminal are electrically connected or not electrically connected.

8. The display substrate according to claim 7, wherein the gate electrode of the first transistor is formed on a second metal layer, and the first electrode of the first transistor is formed on a first metal layer;

the gate electrode of the first transistor is electrically connected to a first connection line portion formed on the second metal layer;

the first electrode of the first transistor is electrically connected to a second connection line portion formed on the second metal layer through a via hole;

the connection line includes a third connection line portion formed on the electrode layer and a fourth connection line portion formed on the first metal layer; the third connection line portion is electrically connected to the fourth connection line portion;

there is an overlapping portion between an orthographic projection of the third connection line portion on the base substrate and an orthographic projection of the first connection line portion on the base substrate; there is an overlapping portion between an orthographic projection of the fourth connection line portion on the base substrate and an orthographic projection of the second connection line portion on the base substrate.

9. The display substrate according to claim 8, further comprising a fifth connection line portion and a sixth connection line portion; wherein the fifth connection line portion is formed on the electrode layer, and the fifth connection line portion is connected to the third connection line portion;

the sixth connection line portion is formed on the first metal layer, and the sixth connection line portion is connected to the fourth connection line portion;

the fifth connection line portion is electrically connected to the sixth connection line portion;

or the display substrate further includes a fifth connection line portion;

the fifth connection line portion is formed on the electrode layer, and the fifth connection line portion is connected to the third connection line portion.

10. The display substrate according to claim 1, wherein the driving circuit further includes an output reset circuit and at least one clock signal line;

a control terminal of the output reset circuit is electrically connected to a reset control terminal, a first terminal of the output reset circuit is electrically connected to a driving signal output terminal of a current stage, and a second terminal of the output reset circuit is electrically connected to the first voltage line, the output reset circuit is configured to control to connect the driving signal output terminal of the current stage and the first voltage line under the control of a reset control signal provided by the reset control terminal;

there is an overlapping portion between the orthographic projection of the connection line on the base substrate and an orthographic projection of the clock signal line on the base substrate;

the control terminal of the output reset circuit is electrically connected to a seventh connection line portion;

there is an overlapping portion between the orthographic projection of the connection line on the base substrate and an orthographic projection of the seventh connection line portion on the base substrate, wherein the output reset circuit includes a reset control terminal and a second transistor;

a gate electrode of the second transistor is electrically connected to the reset control terminal, a first electrode of the second transistor is electrically connected to the driving signal output terminal of the current stage, and a second electrode of the second transistor is electrically connected to the first voltage line;

a reset control terminal of the nth stage of driving circuit is electrically connected to a driving signal output terminal of an (n+p)th stage of driving circuit; p is a positive integer.

11. The display substrate according to claim 1, wherein the driving circuit includes a first driving circuit portion; the first driving circuit portion includes an input circuit, an output reset circuit, a pull-up node control circuit, a first pull-down node control circuit, a second pull-down node control circuit and a reset circuit;

the input circuit is configured to control the potential of the pull-up node under the control of the input signal provided by the input terminal;

the pull-up node control circuit is configured to control the potential of the pull-up node;

the first pull-down node control circuit is configured to control a potential of the first pull-down node;

the second pull-down node control circuit is configured to control a potential of the second pull-down node;

the reset circuit is configured to reset a driving signal provided by the driving signal output terminal of the current stage under the control of the potential of the first pull-down node and the potential of the second pull-down node.

12. The display substrate according to claim 11, wherein the input circuit comprises a first transistor;

a gate electrode of the first transistor is electrically connected to the first input terminal, a first electrode of the first transistor is electrically connected to the second input terminal, and a second electrode of the first transistor is electrically connected to the pull-up node;

the pull-up node control circuit includes a third transistor, a fourth transistor, a fifth transistor and a sixth transistor;

a gate electrode of the third transistor is electrically connected to the reset terminal, a first electrode of the third transistor is electrically connected to the pull-up node, and a second electrode of the third transistor is electrically connected to the second voltage line;

a gate electrode of the fourth transistor is electrically connected to the initial signal line, a first electrode of the fourth transistor is electrically connected to the pull-up node, and a second electrode of the fourth transistor is electrically connected to the second voltage line;

a gate electrode of the fifth transistor is electrically connected to the first pull-down node, a first electrode of the fifth transistor is electrically connected to the pull-up node, and a second electrode of the fifth transistor is electrically connected to the second voltage line;

a gate electrode of the sixth transistor is electrically connected to the second pull-down node, a first electrode of the sixth transistor is electrically connected to the pull-up node, and a second electrode of the sixth transistor is electrically connected to the second voltage line;

the first pull-down node control circuit includes a seventh transistor, an eighth transistor, a ninth transistor, a tenth transistor, and an eleventh transistor;

both a gate electrode of the seventh transistor and a first electrode of the seventh transistor are electrically connected to the first control voltage line, and a second electrode of the seventh transistor is electrically connected to the first pull-down control node;

a gate electrode of the eighth transistor is electrically connected to the pull-up node, a first electrode of the eighth transistor is electrically connected to the first pull-down control node, and a second electrode of the eighth transistor is electrically connected to the second voltage line;

a gate electrode of the ninth transistor is electrically connected to the first pull-down control node, a first electrode of the ninth transistor is electrically connected to the first control voltage line, and a second electrode of the ninth transistor is electrically connected to the first pull-down node;

a gate electrode of the tenth transistor is electrically connected to the pull-up node, a first electrode of the tenth transistor is electrically connected to the first pull-down node, and a second electrode of the tenth transistor is electrically connected to the second voltage line;

a gate electrode of the eleventh transistor is electrically connected to the first input terminal, a first electrode of the eleventh transistor is electrically connected to the first pull-down node, and a second electrode of the eleventh transistor is electrically connected to the second voltage line;

the second pull-down node control circuit includes a twelfth transistor, a thirteenth transistor, a fourteenth transistor, a fifteenth transistor, and a sixteenth transistor;

both a gate electrode of the twelfth transistor and a first electrode of the twelfth transistor are electrically connected to the second control voltage line, and a second electrode of the twelfth transistor is electrically connected to the second pull-down control node;

a gate electrode of the thirteenth transistor is electrically connected to the pull-up node, a first electrode of the thirteenth transistor is electrically connected to the second pull-down control node, and a second electrode of the thirteenth transistor is electrically connected to the second voltage line;

a gate electrode of the fourteenth transistor is electrically connected to the second pull-down control node, a first electrode of the fourteenth transistor is electrically connected to the second control voltage line, and a second electrode of the fourteenth transistor is electrically connected to the second pull-down node;

a gate electrode of the fifteenth transistor is electrically connected to the pull-up node, a first electrode of the fifteenth transistor is electrically connected to the second pull-down node, and a second electrode of the fifteenth transistor is electrically connected to the second voltage line;

a gate electrode of the sixteenth transistor is electrically connected to the first input terminal, a first electrode of the sixteenth transistor is electrically connected to the second pull-down node, and a second electrode of the sixteenth transistor is electrically connected to the second voltage line;

the reset circuit includes a seventeenth transistor, an eighteenth transistor, a nineteenth transistor and a twentieth transistor;

a gate electrode of the seventeenth transistor is electrically connected to the first pull-down node, a first electrode of the seventeenth transistor is electrically connected to the driving signal output terminal of the current stage, and a second electrode of the seventeenth transistor electrically connected to the first voltage line;

a gate electrode of the eighteenth transistor is electrically connected to the first pull-down node, a first electrode of the eighteenth transistor is electrically connected to a carry signal output terminal of a current stage, and a second electrode of the eighteenth transistor electrically connected to the second voltage line;

a gate electrode of the nineteenth transistor is electrically connected to the second pull-down node, a first electrode of the nineteenth transistor is electrically connected to the driving signal output terminal of the current stage, and a second electrode of the nineteenth transistor is electrically connected to the first voltage line;

a gate electrode of the twentieth transistor is electrically connected to the second pull-down node, a first electrode of the twentieth transistor is electrically connected to the carry signal output terminal of the current stage, and a second electrode of the twentieth transistor is electrically connected to the second voltage line, wherein the orthographic projection of the connection line on the base substrate partially overlaps an orthographic projection of the gate electrode of the fourth transistor on the base substrate;

the orthographic projection of the connection line on the base substrate partially overlaps an orthographic projection of the gate electrode of the thirteenth transistor on the base substrate;

the orthographic projection of the connection line on the base substrate partially overlaps an orthographic projection of the gate electrode of the fifteenth transistor on the base substrate;

the orthographic projection of the connection line on the base substrate partially overlaps an orthographic projection of the gate electrode of the sixteenth transistor on the base substrate;

the orthographic projection of the connection line on the base substrate partially overlaps an orthographic projection of the gate electrode of the twentieth transistor on the base substrate;

the orthographic projection of the connection line on the base substrate partially overlaps an orthographic projection of the gate electrode of the nineteenth transistor on the base substrate;

the orthographic projection of the connection line on the base substrate partially overlaps an orthographic projection of the gate electrode of the sixteenth transistor on the base substrate.

13. The display substrate according to claim 11, wherein the driving circuit further includes a second driving circuit portion;

the second driving circuit portion includes a twenty-first transistor and a twenty-second transistor;

a gate electrode of the twenty-first transistor is electrically connected to the pull-up node, a first electrode of the twenty-first transistor is electrically connected to the output clock signal terminal, and a second electrode of the twenty-first transistor is connected to the driving signal output terminal of the current stage;

a gate electrode of the twenty-second transistor is electrically connected to the pull-up node, a first electrode of the twenty-second transistor is electrically connected to the output clock signal terminal, and a second electrode of the twenty-second transistor is electrically connected to the carry signal output terminal of the current stage, wherein the second driving circuit portion further comprises a second transistor;

a gate electrode of the second transistor is electrically connected to the reset control terminal, a first electrode of the second transistor is electrically connected to the driving signal output terminal of the current stage, and a second electrode of the second transistor is electrically connected to the first voltage line.

14. A repair method applied to a display substrate including
- a base substrate and a driving module arranged on the base substrate; wherein the driving module includes N driving circuits connected in series;
- the driving circuit includes an input terminal; N is a positive integer;
- input terminals of first a stages of driving circuits included in the driving module are electrically connected to an initial voltage line; a is a positive integer;
- an input terminal of an nth stage of driving circuit included in the driving module is electrically connected to an output terminal of an (n−m)th stage of driving circuit included in the driving module through an input cascade line; n and m are positive integers, and m is less than n;
- the driving module further includes at least one connection line, and the connection line extends along a first direction;
- there is an overlapping portion between an orthographic projection of the connection line on the base substrate and an orthographic projection of the initial voltage line on the base substrate;
- there is an overlapping portion between an orthographic projection of the connection line on the base substrate and an orthographic projection of the input cascade line on the base substrate, wherein the repair method comprises:
- when first c stages of driving circuits included in the driving module in the display substrate are cut off, controlling the connection line to be electrically connected to the initial voltage line, and controlling the connection line to be electrically connected to an input terminal of a first predetermined driving circuit included in the driving module;
- the first predetermined driving circuit is a (c+1)th stage of driving circuit to a (c+a)th stage of driving circuit;
- both c and a are positive integers,
- wherein the driving circuit further includes a reset control terminal and at least one clock signal line; the reset control terminal of the nth stage of driving circuit included in the driving module is electrically connected to an output terminal of an (nm.)th stage of driving circuit included in the driving module through a reset cascade line; b is a positive integer; the repair method includes: when it is detected that the reset cascade line is short-circuited, cutting off a short-circuit point between the reset cascade line and other signal lines; controlling electrical connection between the connection line and the reset cascade line, and controlling electrical connection between the connection line and a corresponding clock signal line.

15. The repair method according to claim 14, wherein the driving circuit further includes a reset control terminal and at least one clock signal line; the reset control terminal of the nth stage of driving circuit included in the driving module is electrically connected to an output terminal of an (n+b)th stage of driving circuit included in the driving module through a reset cascade line; n and b are positive integers; the repair method includes:
- when the reset cascade line is disconnected, controlling electrical connection between the connection line and the reset cascade line, and controlling electrical connection between the connection line and a corresponding clock signal line.

16. The repair method according to 15, further comprising:
- selecting the corresponding clock signal line according to a timing of the reset control signal that the reset control terminal needs to access, so that when the driving signal provided by the driving signal terminal included in the nth stage of driving circuit needs to be reset, providing, by the corresponding clock signal line, a valid clock signal.

17. A display device including
a display substrate comprising:
- a base substrate and a driving module arranged on the base substrate; wherein
- the driving module includes N driving circuits connected in series;
- the driving circuit includes an input terminal; N is a positive integer;
- input terminals of first a stages of driving circuits included in the driving module are electrically connected to an initial voltage line; a is a positive integer;
- an input terminal of an nth stage of driving circuit included in the driving module is electrically connected to an output terminal of an (n−m)th stage of driving circuit included in the driving module through an input cascade line; n and m are positive integers, and m is less than n;
- the driving module further includes at least one connection line, and the connection line extends along a first direction;
- there is an overlapping portion between an orthographic projection of the connection line on the base substrate and an orthographic projection of the initial voltage line on the base substrate;
- there is an overlapping portion between the orthographic projection of the connection line on the base substrate and an orthographic projection of the input cascade line on the base substrate,
- wherein the driving module includes a plurality of clock signal lines, a plurality of stages of driving circuits and a line collection portion; the driving circuit includes a first driving circuit portion and a second driving circuit portion;
- the plurality of clock signal lines, the first driving circuit portion, the line collection portion and the second driving circuit portion are arranged in sequence along a direction close to a display area; the input cascade line is arranged in the line collection portion; the driving circuit includes the first driving circuit portion and the second driving circuit portion, and wherein the second driving circuit portion includes an output transistor in the driving circuit; the first driving circuit portion includes a pull-up node control sub-circuit, a pull-down node control sub-circuit and an output reset sub-circuit; the pull-up node control sub-circuit is configured to control a potential of the pull-up node, and the pull-down node control sub-circuit is configured to control a potential of the pull-down node, and the output reset sub-circuit is used to reset a driving signal under the control of the potential of the pull-down node.

* * * * *